(12) United States Patent
Begley et al.

(10) Patent No.: US 7,563,518 B2
(45) Date of Patent: *Jul. 21, 2009

(54) LOW VOLTAGE ORGANIC ELECTROLUMINESCENT ELEMENT

(75) Inventors: William J. Begley, Webster, NY (US); Tukaram K. Hatwar, Penfield, NY (US); Natasha Andrievsky, Webster, NY (US)

(73) Assignee: Eastman Kodak Company, Rochester, NY (US)

(*) Notice: Subject to any disclaimer, the term of this patent is extended or adjusted under 35 U.S.C. 154(b) by 476 days.

This patent is subject to a terminal disclaimer.

(21) Appl. No.: 11/192,072

(22) Filed: Jul. 28, 2005

(65) Prior Publication Data

US 2007/0026257 A1 Feb. 1, 2007

(51) Int. Cl.
H01L 51/54 (2006.01)

(52) U.S. Cl. .................. 428/690; 428/917; 313/504; 313/506; 257/E51.043; 257/E51.049; 257/E51.05

(58) Field of Classification Search .......... 428/690, 428/917; 427/58, 66; 313/502–509; 257/40, 257/88–103, E51.001–E51.052; 252/301.16–301.35
See application file for complete search history.

(56) References Cited

U.S. PATENT DOCUMENTS

| | | | |
|---|---|---|---|
| 5,516,577 A | 5/1996 | Matsuura et al. | |
| 6,013,384 A * | 1/2000 | Kido et al. | 428/690 |
| 6,150,042 A * | 11/2000 | Tamano et al. | 428/690 |
| 6,396,209 B1 | 5/2002 | Kido et al. | |
| 6,660,411 B2 * | 12/2003 | Sato et al. | 428/690 |
| 6,692,846 B2 * | 2/2004 | Hatwar et al. | 428/690 |
| 6,822,257 B2 * | 11/2004 | Lee et al. | 257/40 |
| 6,995,509 B2 * | 2/2006 | Yamazaki et al. | 313/504 |
| 2001/0043044 A1 | 11/2001 | Wakimoto et al. | |
| 2001/0052751 A1 | 12/2001 | Wakimoto et al. | |
| 2002/0086180 A1 | 7/2002 | Seo et al. | |
| 2004/0161633 A1* | 8/2004 | Seo et al. | 428/690 |
| 2004/0207318 A1 | 10/2004 | Lee et al. | |
| 2005/0064235 A1 | 3/2005 | Liao et al. | |
| 2005/0123791 A1 | 6/2005 | Deaton et al. | |
| 2005/0151466 A1 | 7/2005 | Liao et al. | |
| 2006/0204786 A1* | 9/2006 | Begley et al. | 428/690 |
| 2006/0246315 A1* | 11/2006 | Begley et al. | 428/690 |
| 2006/0286405 A1* | 12/2006 | Begley et al. | 428/690 |
| 2007/0048545 A1* | 3/2007 | Hatwar et al. | 428/690 |
| 2007/0092754 A1* | 4/2007 | Begley et al. | 428/690 |
| 2007/0092755 A1* | 4/2007 | Begley et al. | 428/690 |
| 2007/0092756 A1* | 4/2007 | Begley et al. | 428/690 |

FOREIGN PATENT DOCUMENTS

| | | |
|---|---|---|
| EP | 1 220 339 | 7/2002 |
| JP | 2003338377 | * 11/2003 |

OTHER PUBLICATIONS

Machine Translation of JP 2003338377.*
M. Ben Khalifa, et al., "Opposing Influence of Hole Blocking Layer and a Doped Transport Layer on the Performance of Heterostructure OLEDs", Organic Electronics, vol. 5, Dec. 13, 2003, pp. 187-198.
W. J. Begley, et al., "Organic Light-Emitting Devices with Mixed Electron Transport Materials", U.S. Appl. No. 11/076,821 (D-89132) filed Mar. 10, 2005.
W. J. Begley, et al., "Organic Light-Emitting Devices with Mixed Electron Transport Materials", U.S. Appl. No. 11/077,218 (D-89133) filed Mar. 10, 2005.
W. J. Begley, et al., "Phosphorescent OLED with Mixed Electron Transport Materials", U.S. Appl. No. 11/116,096 (D-89655) filed Apr. 27, 2005.

* cited by examiner

Primary Examiner—Marie R. Yamnitzky
(74) Attorney, Agent, or Firm—Arthur E Kleugel; Raymond L. Owens

(57) ABSTRACT

An OLED device comprises a cathode, an electron-transporting layer (ETL), a light-emitting layer (LEL) containing a fluorescent light-emitting material, a hole-transporting layer (HTL), and an anode, in that order, wherein the ETL comprises a mixture of compounds, including a first compound and at least one second compound, and wherein there is present a hole blocking layer (HBL) adjacent to the LEL on the cathode side. It provides a reduced drive voltage with comparable color hue. The first compound is present in an amount of 50% to 90% by volume and is represented by Formula (2):

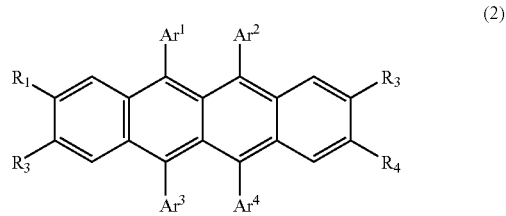

(2)

Wherein $R_1$ and $R_4$ represent the substituent and neither are hydrogen; $R_2$ and $R_3$ represent hydrogen; $Ar^1$ and $Ar^4$ represent the same aromatic group; and $Ar^2$ and $Ar^3$ represent the same aromatic group.

13 Claims, 1 Drawing Sheet

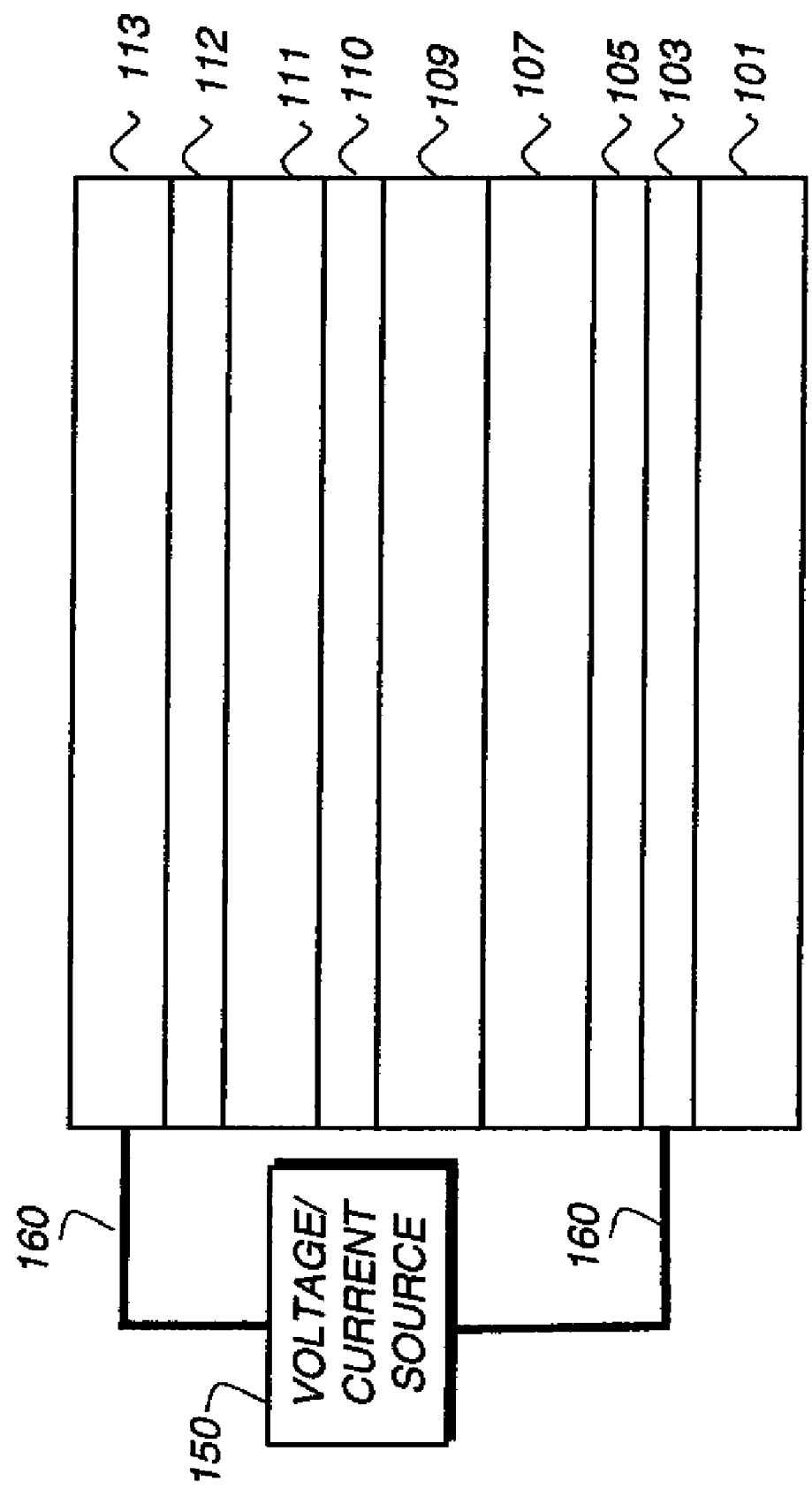

LOW VOLTAGE ORGANIC ELECTROLUMINESCENT ELEMENT

CROSS-REFERENCE TO RELATED APPLICATIONS

Reference is made to commonly assigned U.S. patent applications U.S. Ser. No. 11/076,821 filed Mar. 10, 2005 (now abandoned); U.S. Ser. No. 11/077,218 filed Mar. 10, 2005 (publication No. US 2006/0204784); and U.S. Ser. No. 11/116,096 filed Apr. 27, 2005 (now abandoned; publication No. US 2006/0246315).

FIELD OF THE INVENTION

This invention relates to an organic light-emitting diode (OLED) electroluminescent (EL) device having a light-emitting layer including a fluorescent light-emitting material, a hole-blocking layer adjacent to the light-emitting layer, and a layer between the hole-blocking layer and the cathode containing a mixture of at least two compounds.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, 30, 322, (1969); and Dresner U.S. Pat. No. 3,710,167, issued Jan. 9, 1973. The organic layers in these devices, usually composed of a polycyclic aromatic hydrocarbon, were very thick (much greater than 1 µm). Consequently, operating voltages were very high, often greater than 100V.

More recent organic EL devices include an organic EL element consisting of extremely thin layers (e.g. <1.0 µm) between the anode and the cathode. Herein, the term "organic EL element" encompasses the layers between the anode and cathode. Reducing the thickness lowered the resistance of the organic layers and has enabled devices that operate at much lower voltage. In a basic two-layer EL device structure, described first in U.S. Pat. No. 4,356,429, one organic layer of the EL element adjacent to the anode is specifically chosen to transport holes, and therefore is referred to as the hole-transporting layer, and the other organic layer is specifically chosen to transport electrons and is referred to as the electron-transporting layer. Recombination of the injected holes and electrons within the organic EL element results in efficient electroluminescence.

There have also been proposed three-layer organic EL devices that contain an organic light-emitting layer (LEL) between the hole-transporting layer and electron-transporting layer, such as that disclosed by C. Tang et al. (*J. Applied Physics*, Vol. 65, 3610 (1989)). The light-emitting layer commonly consists of a host material doped with a guest material, otherwise known as a dopant. Still further, there has been proposed in U.S. Pat. No. 4,769,292 a four-layer EL element comprising a hole injecting layer (HIL), a hole-transporting layer (HTL), a light-emitting layer (LEL) and an electron-transporting/injecting layer (ETL). These structures have resulted in improved device efficiency.

Since these early inventions, further improvements in device materials have resulted in improved performance in attributes such as color, stability, luminance efficiency and manufacturability, e.g., as disclosed in U.S. Pat. Nos. 5,061,569, 5,409,783, 5,554,450, 5,593,788, 5,683,823, 5,908,581, 5,928,802, 6,020,078, and 6,208,077, amongst others.

Notwithstanding these developments, there are continuing needs for organic EL device components, such as light-emitting materials, sometimes referred to as dopants, that will provide high luminance efficiencies combined with high color purity and long lifetimes. In particular, there is a need to be able to adjust the emission wavelength of the light-emitting material for various applications. For example, in addition to the need for blue, green, and red light-emitting materials there is a need for blue-green, yellow and orange light-emitting materials in order to formulate white-light emitting electroluminescent devices. For example, a device can emit white light by emitting a combination of colors, such as blue-green light and red light or a combination of blue light and yellow light.

The preferred spectrum and precise color of a white EL device will depend on the application for which it is intended. For example, if a particular application requires light that is to be perceived as white without subsequent processing that alters the color perceived by a viewer, it is desirable that the light emitted by the EL device have 1931 Commission International d'Eclairage (CIE) chromaticity coordinates, (CIEx, CIEy), of about (0.33, 0.33). For other applications, particularly applications in which the light emitted by the EL device is subjected to further processing that alters its perceived color, it can be satisfactory or even desirable for the light that is emitted by the EL device to be off-white, for example bluish white, greenish white, yellowish white, or reddish white.

White EL devices can be used with color filters in full-color display devices. They can also be used with color filters in other multicolor or functional-color display devices. White EL devices for use in such display devices are easy to manufacture, and they produce reliable white light in each pixel of the displays. Although the OLEDs are referred to as white, they can appear white or off-white, for this application, the CIE coordinates of the light emitted by the OLED are less important than the requirement that the spectral components passed by each of the color filters be present with sufficient intensity in that light. Thus there is a need for new materials that provide high luminance intensity for use in white OLED devices.

A useful class of electron-transporting materials is that derived from metal chelated oxinoid compounds including chelates of oxine itself, also commonly referred to as 8-quinolinol or 8-hydroxyquinoline.

Tris(8-quinolinolato)aluminum (III), also known as Alq or $Alq_3$, and other metal and non-metal oxine chelates, are well known in the art as electron-transporting materials.

Tang et al., in U.S. Pat. No. 4,769,292 and VanSlyke et al., in U.S. Pat. No. 4,539,507 lower the drive voltage of the EL devices by teaching the use of Alq as an electron transport material in the luminescent layer or luminescent zone.

Baldo et al., in U.S. Pat. No. 6,097,147 and Hung et al., in U.S. Pat. No. 6,172,459 teach the use of an organic electron-transporting layer adjacent to the cathode so that when electrons are injected from the cathode into the electron-transporting layer, the electrons traverse both the electron-transporting layer and the light-emitting layer.

The use of a mixed layer of a hole-transporting material and an electron-transporting material in the light-emitting layer is well known. For example, see US 2004/0229081; U.S. Pat. Nos. 6,759,146, 6,759,146; 6,753,098; and 6,713,192 and references cited therein. Kwong and co-workers, US 2002/0074935, describe a mixed layer comprising an organic small molecule hole-transporting material, an organic small molecule electron-transporting material and a phosphorescent dopant.

Tamano et al., in U.S. Pat. No. 6,150,042 teaches use of hole-injecting materials in an organic EL device. Examples of electron-transporting materials useful in the device are given and included therein are mixtures of electron-transporting materials.

Wakimoto and coworkers describe an electroluminescence element including a hole-blocking layer made of an organic compound laminated between the light emitting layer and the electron transport layer. The hole-blocking layer is a mixed layer made of plural kinds of electron transport materials.

Seo et al., in US 2002/0086180 teaches the use of a 1:1 mixture of Bphen, (also known as 4,7-diphenyl-1,10-phenanthroline or bathophenanthroline) as an electron-transporting material, and Alq as an electron injection material, to form an electron-transporting mixed layer. However, the Bphen/Alq mix of Seo et al. shows inferior stability.

Organometallic complexes, such as lithium quinolate have been used in EL devices, for example see WO 0032717 and US 2005/0106412. In particular mixtures of lithium quinolate and Alq have been described as useful, for example see U.S. Pat. No. 6,396,209 and US 2004/0207318.

Commonly assigned U.S. Ser. Nos. 11/076,821 (now abandoned); 11/077,218 (publication No. US 2006/0204784; and Ser. No. 11/116,096 (now abandoned; publication No. US 2006/0246315) describe mixing a first compound with a second compound that is a low voltage electron transport material, to form a layer on the cathode side of the emitting layer in an OLED device, which gives an OLED device that has a drive voltage even lower than that of the device with the low voltage electron transport material. In some cases a metallic material based on a metal having a work function less than 4.2 eV is included in the layer. However, in many cases, incorporating this mixture of compounds in the ETL results in a device whose color is shifted to a less desirable hue.

Thus, previously described devices do not have all the desired EL characteristics. There remains a need to reduce drive voltage of OLED devices while maintaining purity of the color produced.

SUMMARY OF THE INVENTION

The invention provides an OLED device comprising a cathode, an electron-transporting layer (ETL), a light-emitting layer (LEL) containing a fluorescent light-emitting material, a hole-transporting layer (HTL), and an anode, in that order, wherein the ETL comprises a mixture of compounds, including a first compound and at least one second compound, and wherein there is present a hole blocking layer (HBL) adjacent to the LEL on the cathode side.

The invention enables the reduction in drive voltage of OLED devices while maintaining purity of the color produced at a comparable level.

BRIEF DESCRIPTION OF THE DRAWINGS

The FIGURE shows a cross-sectional schematic view of one embodiment of the device of the present invention.

DETAILED DESCRIPTION OF THE INVENTION

The OLED device of the invention includes a cathode, an electron-transporting layer (ETL), a light-emitting layer (LEL) containing a fluorescent light-emitting material, a hole-transporting layer (HTL), and an anode. The ETL includes a mixture of compounds, including a first compound and at least one second compound. There is a hole-blocking layer (HBL) present which is adjacent to the LEL on the cathode side.

In one desirable embodiment of the invention, the electron-transporting layer contains a first compound that has the lowest LUMO (Lowest Unoccupied Molecular Orbital) value of the compounds in the layer and at least one of the second compounds is a low voltage electron transport material. LUMO and HOMO (Highest Occupied Molecular Orbital) energy levels are typically determined experimentally by electrochemical methods, as further illustrated in Example 2. LUMO and HOMO values may also be calculated.

LUMO and HOMO energy levels can be determined from redox properties of molecules, which can be measured by well-known literature procedures, such as cyclic voltammetry (CV) and Osteryoung square-wave voltammtry (SWV). For a review of electrochemical measurements, see J. O. Bockris and A. K. N. Reddy, *Modern Electrochemistry*, Plenum Press, New York; and A. J. Bard and L. R. Faulkner, *Electrochemical Methods*, John Wiley & Sons, New York, and references cited therein LUMO and HOMO energy levels can also be calculated. Typical calculations are carried out by using the B3LYP method as implemented in the Gaussian 98 (Gaussian, Inc., Pittsburgh, Pa.) computer program. The basis set for use with the B3LYP method is defined as follows: MIDI! for all atoms for which MIDI! is defined, 6-31G* for all atoms defined in 6-31G* but not in MIDI!, and either the LACV3P or the LANL2DZ basis set and pseudopotential for atoms not defined in MIDI! or 6-31 G*, with LACV3P being the preferred method. For any remaining atoms, any published basis set and pseudopotential may be used. MIDI!, 6-31G* and LANL2DZ are used as implemented in the Gaussian98 computer code and LACV3P is used as implemented in the Jaguar 4.1 (Schrodinger, Inc., Portland Oreg.) computer code.

Desirably the second compound(s) has a higher LUMO value(s) than the first compound. In one suitable embodiment, the first compound has a LUMO value lower than −2.30 eV, typically lower than −2.50 eV or −2.60 eV and desirably lower than −2.70 eV or even lower than −3.00 eV.

In this aspect of the invention, at least one of the second compounds is a low voltage electron transport material. As used herein, the term "low voltage electron transport material" is a material that when incorporated alone into the electron-transporting layer results in a drive voltage no more than 100% greater than an analogous device using only Alq in the electron-transporting layer. Thus, a test for a low-voltage material involves fabricating a device using Alq (tris(8-quinolinolato)aluminum (III)) as the electron transport material, illustrated in Example 3. A second device is fabricated replacing Alq with the material to be tested as a low-voltage electron transport material. If the second device has a drive voltage (referred to herein as a test voltage) no more than 100% greater than the device using Alq, than the test material is considered a low-voltage electron transport material. More desirable low-voltage electron transport materials afford a test voltage no more than 80% greater, or no more than 60% greater, or even no more than 50% greater, typically no more than 40% greater, commonly no more than 30%, and desirably no more than 25% greater than Alq. Ideally, low-voltage electron transport materials afford a test voltage no more than 20% greater than Alq, suitably no more than 10% greater, and preferably equal to or less than Alq, under the test conditions.

Typically, "low voltage electron transport material" are those materials that when incorporated alone into the electron-transporting layer, as described in Example 3, result in drive voltages of 16 volts or less. Desirably they are 15 volts or less, 14 volts or less, or even 13 volts or less. Low voltage electron transport materials with drive voltages of 12 volts, 11 volts, or 10 volts or less are also useful as second compounds of the invention while materials of 9 volts or 8 volts or less are preferred as second compounds. It should be understood that there may be some small experimental variation in the test conditions which may be minimized by comparing the performance of new materials to that of Alq as described previously.

The amount of the first compound present in the electron-transporting layer is greater than or equal to 10% by volume, but cannot be 100%. In one suitable embodiment the first compound is present in the range of 20-90%, or desirably, in the range of 40-90%, and more typically in the range of 50-80% of the layer by volume. The total amount of the second compound(s) present in the layer is less than or equal to 90% by volume, but cannot be 0%. In other embodiments of the invention, particularly useful levels for the first compound are 20, 40, 50, 60, 75 or 90% with corresponding levels of 80, 60, 50, 40, 25 or 10% respectively for the total amount of the second compound(s).

In one embodiment of the invention, the electron-transporting layer comprises a first compound, a second compound and at least one additional compound. In one suitable embodiment, an additional compound is a metallic material based on a metal having a work function less than 4.2 eV. The definition of work function can be found in *CRC Handbook of Chemistry and Physics,* 70th Edition, 1989-1990, CRC Press Inc., page F-132 and a list of the work functions for various metals can be found on pages E-93 and E-94. As used herein the term "metallic material" includes both the elemental metal and compounds thereof. In this embodiment, the metal of said further layer is not restricted to a specific one, as long as it is a metal that can reduce at least one of the organic compounds. It can be selected from the alkali metals such as Li, alkali earth metals such as Mg and transition metals including rare earth metals. In particular, the metal having a work function of less than or equal to 4.2 eV can be suitably used as the metal, and typical examples of such dopant metals include Li, Na, K, Be, Mg, Ca, Sr, Ba, Y, La, Sm, Gd, Yb. In one desirable embodiment the metallic material is Li metal. Desirably, the metallic material is present at a level of from 0.1 to 15% by volume of the layer, and typically 0.1% to 10% and more frequently from 1 to 8%.

The Figure shows one embodiment of the invention in which hole-injecting and electron-injecting layers are present. The first compound and the second compound(s) are located in the electron-transporting layer (ETL, 111). A hole-blocking layer (HBL, 110) is between the light-emitting layer (LEL, 109) and the electron-transporting layer. The Figure shows a hole-injecting layer (HIL, 105) and an electron-injecting layer (EIL, 112), but these are optional. The electron-transporting layer in this embodiment is adjacent to the electron-injecting layer. When there is no electron-injecting layer present, the electron-transporting layer is adjacent to the cathode. In other embodiments there may be more than one hole-injecting, electron-injecting and electron-transporting layers.

The electron-transporting layer as described above, can be an emitting or non-emitting layer. Typically, the primary function of the layer is to transport electrons with the result that the OLED device requires a lower voltage for operation than either of the first or second compound alone in the device. When emitting, the electroluminescence from said layer can enhance the overall emission from the device. When non-emitting, either the first or second compound or both should desirably be essentially colorless or non-emitting. In one desirable embodiment, the layer, as described above, is non-emitting.

In one useful embodiment of the invention the first compound, which has the lowest LUMO in the layer, contains at least two fused rings. At least one of the two fused rings can be a carbocyclic ring, or at least one of the fused rings can be a heterocyclic ring. Suitably, the first compound contains three fused rings, four fused rings, or even more fused rings. At least one of the three fused rings can be a carbocyclic ring, or at least one of the fused rings can be a heterocyclic ring.

In one suitable embodiment, the first compound is a polycyclic hydrocarbon compound and thus does not contain heteroatoms. In another suitable embodiment the first compound is a polycyclic hydrocarbon having at least 3 fused rings and the second compound is an organometallic compound such as tris(8-quinolinolato)aluminum (III) (Alq).

As used herein and throughout this application, the term carbocyclic and heterocyclic rings or groups are generally as defined by the *Grant & Hackh's Chemical Dictionary*, Fifth Edition, McGraw-Hill Book Company. A carbocyclic ring is any aromatic or non-aromatic ring system containing only carbon atoms and a heterocyclic ring is any aromatic or non-aromatic ring system containing both carbon and non-carbon atoms such as nitrogen (N), oxygen (O), sulfur (S), phosphorous (P), silicon (Si), gallium (Ga), boron (B), beryllium (Be), indium (In), aluminum (Al), and other elements found in the periodic table useful in forming ring systems. For the purpose of this invention, also included in the definition of a heterocyclic ring are those rings that include coordinate bonds. The definition of a coordinate bond can be found in *Grant & Hackh's Chemical Dictionary*, page 91. In essence, a coordinate bond is formed when electron rich atoms such as O or N, donate a pair of electrons to electron deficient atoms such as Al or B. One such example is found in tris(8-quinolinolato) aluminum(III), also referred to as Alq, wherein the nitrogen on the quinoline moiety donates its lone pair of electrons to the aluminum atom thus forming the heterocycle and hence providing Alq with a total of 3 fused rings.

Carbocyclic and heterocyclic ring systems useful for the current invention for the first and second compounds are selected from metal and non-metal chelated oxinoids, anthracenes, bipyridyls, butadienes, imidazoles, phenanthrenes, phenanthrolines, styrylarylenes, benzazoles, buckministerfullerene-$C_{60}$ (also known as buckyball or fullerene-$C_{60}$), tetracenes, xanthenes, perylenes, coumarins, rhodamines, quinacridones, dicyanomethylenepyrans, thiopyrans, polymethines, pyrylliums, fluoranthenes, periflanthrenes, silacyclopentadienes or siloles, thiapyrylliums, triazines, carbostyryls, metal and non-metal chelated bis (azinyl)amines, metal and non-metal chelated bis(azinyl) methenes.

In one embodiment, first compounds can be selected from naphthacene derivatives that are represented by Formulae (1).

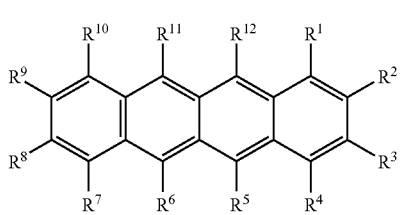

(1)

In Formula (1) $R^1, R^2, R^3, R^4, R^5, R^6, R^7, R^8, R^9, R^{10}, R^{11}$, and $R^{12}$ are independently selected from the group consisting of hydrogen and substituents, provided that any of the indicated substituents may join to form further fused rings. In one desirable embodiment $R^5, R^6, R^{11}$, and $R^{12}$, represent independently selected aromatic ring groups. In another suitable embodiment $R^1, R^2, R^3, R^4, R^7, R^8, R^9, R^{10}$ represent hydrogen.

In another aspect of the invention, the first compound in the electron-transporting layer is represented by Formula (2).

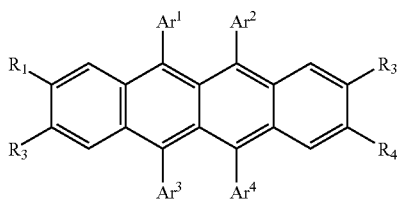

(2)

In Formula (2), $R_1$ and $R_4$ represent the same substituent, for example an alkyl groups or an aryl group, and neither are hydrogen. $R_2$ and $R_3$ represent hydrogen or a substituent. Suitably, $R_2$ and $R_3$ represent hydrogen. $Ar^1$ and $Ar^4$ represent the same aromatic group, such as an aryl group. $Ar^2$ and $Ar^3$ represent the same aromatic group which may be the same or different than that represented by $Ar^1$ and $Ar^4$.

In further aspect of the invention, the first compound in the electron-transporting layer is represented by Formula (3).

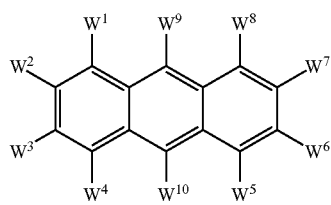

(3)

In Formula (3), $W^1$-$W^{10}$ independently represent hydrogen or an independently selected substituent, provided that two adjacent substituents can combine to form rings. In one aspect of the invention, $W^9$ and $W^{10}$ represent independently selected naphthyl groups or biphenyl groups. For example, $W^9$ and $W^{10}$ may represent such groups as 1-naphthyl, 2-naphthyl, 4-biphenyl, and 3-biphenyl. In another desirable embodiment, at least one of $W^9$ and $W^{10}$ represents an anthracene group. In a further aspect of the invention, $W^1$-$W^8$ represent hydrogen.

In one embodiment the first and second compounds can be selected from compounds represented by Formula 4.

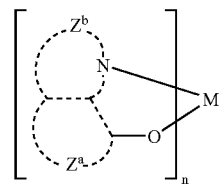

(4)

M can be an alkali metal, such as lithium, sodium, or potassium; an alkaline earth metal, such as magnesium or calcium; an earth metal, such as aluminum or gallium, or a transition metal such as zinc or zirconium. Generally any monovalent, divalent, trivalent, or tetravalent metals known to be a useful chelating metal can be employed. Also included are boron and beryllium. In one desirable embodiment, M represents Al or Ga.

In Formula (4), n is an integer of from 1 to 4, and is equal to the oxidation state of the metal. For example for $Al^{+3}$, n would be 3.

Each $Z^a$ and $Z^b$ independently represents the atoms necessary to complete an aromatic ring group, for example, a benzene ring group or a pyridine ring group. In one embodiment, $Z^a$ and $Z^b$ form an 8-quinolinolato ligand, which is a ligand derived from 8-hydroxyquinoline wherein the nitrogen in the 1-position of quinoline coordinates, by donating its free pair of electrons to a metal bound to the hydroxyl group in the 8-position, with the metal atom accepting the electrons, to form a coordinate bond and a chelated or heterocyclic ring system.

In another embodiment the first and second compounds can be selected from compounds represented by Formula (4a).

$$(M^a)_p(Q)_p \quad (4a)$$

In Formula (4a), $M^a$ represents a monovalent metal. In one suitable embodiment $M^a$ is a Group IA metal such as $Li^+$, $Na^+$, $K^+$, $Cs^+$, and $Rb^+$. In one desirable embodiment $M^a$ represents $Li^+$.

In Formula (4a), each Q is a ligand. Desirably each Q has a net charge of −1. In one suitable embodiment Q is a bidentate ligand. For example Q can represent an 8-quinolate group.

In Formula (4a), p represents an integer, commonly 1-6. Thus the organometallic complex can form dimers, trimers, tetramers, pentamers, hexamers and the like. However, the organometallic complex can also form a one dimensional chain structure in which case p is greater than 6.

In another desirable embodiment, the first and second compounds can be selected from compounds represented by Formula (4b).

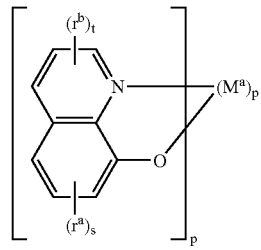

(4b)

In Formula (4b), $M^a$ represents a monovalent metal, as described previously. In one desirable embodiment, $M^a$ represents $Li^+$. Each $r^a$ and $r^b$ represents an independently selected substituent, provided two substituents may combine to form a fused ring group. Examples, of such substituents include a methyl group, a phenyl group, a fluoro substituent and a fused benzene ring group formed by combining two substituents. In Formula (4b), t is 1-3, s is 1-3 and p is an integer.

In another embodiment the first and second compounds can be selected from compounds represented by Formula (5).

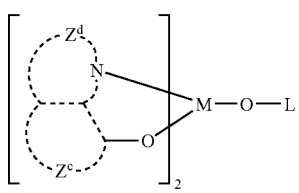

(5)

In Formula (5), M represents a metal as described previously. Desirably, M is Al or Ga. Each $Z^c$ and $Z^d$ independently represent the atoms necessary to complete an aromatic ring group. In one embodiment at least one of $Z^c$ and $Z^d$ includes one or more ring substituents chosen to block sterically the attachment of more than two bidentate ligands to M. L represents an alkyl group, carbocyclic group or a heterocyclic groups. Suitable L groups include hydrocarbons of from 6 to 24 carbon atoms. In one embodiment, L represents an aromatic ring group, such as a phenyl group.

In a further embodiment the second compound of the electron-transporting layer can be selected from a phenanthroline derivatives represented by Formula (6).

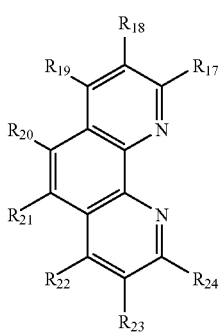

(6)

In Formula (6), $R_{17}$, $R_{18}$, $R_{19}$, $R_{20}$, $R_{21}$, $R_{22}$, $R_{23}$ and $R_{24}$ are hydrogen or substituents; and provided that any of the indicated substituents may join to form further fused rings.

Heterocyclic derivatives, represented by Formula (7), also form a group of materials from which the second compounds of the electron-transporting layer can be selected.

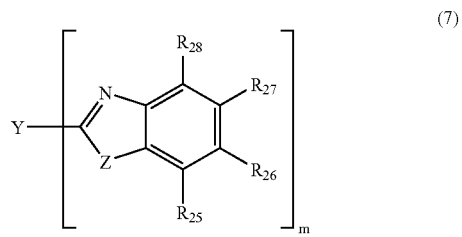

(7)

In Formula (7), m is an integer of from 3 to 8. Z represents O, $NR_{29}$, or S. $R_{25}$, $R_{26}$, $R_{27}$, $R_{28}$ and $R_{29}$ represent hydrogen or a substituent, provided two substituent groups may combine to form a fused ring. For example, $R_{25}$, $R_{26}$, $R_{27}$, $R_{28}$ and $R_{29}$ may represent an alkyl, such as a methyl or an aryl group, such as a phenyl group. In Formula (7), Y is a linkage unit, such as an alkyl or aryl group, that conjugately or unconjugately connects the multiple benzazoles together. Suitable Y groups include aryl or biphenyl groups.

Additional second compounds of the electron-transporting layer can be selected from silacyclopentadiene or silole derivatives represented by Formula (8).

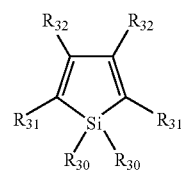

(8)

wherein

In Formula (8), $R_{30}$, $R_{31}$, and $R_{32}$ represent hydrogen or a substituent, provided two substituent groups may combine to form a fused carbocyclic or heterocyclic.

Other second compounds of the electron-transporting layer can be selected from triazine derivatives represented by Formula (9).

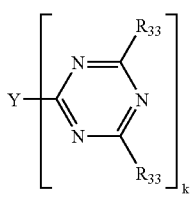

(9)

In Formula (9), k is an integer of from 1 to 4; $R_{33}$ represents hydrogen, or a substituent. Y has been described and is a linkage unit usually comprising an alkyl or ary group that conjugately or unconjugately connects the multiple triazines together. Suitable Y groups include aryl or biphenyl groups.

Suitable first compounds can be prepared by methods known in the art. Especially useful naphthacene materials of Formula (1) and (2) can be prepared by reacting a propargyl alcohol with a reagent capable of forming a leaving group followed by heating in the presence of a solvent to form a naphthacene. See commonly assigned U.S. Ser. Nos. 10/899,821 and 10/899,825 filed Jul. 27, 2004 now U.S. Pat. Nos. 7,323,610 and 7,429,683 respectively.

Listed below are illustrative examples of suitable first compounds.
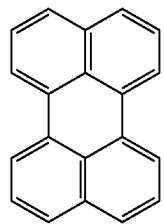 A-2
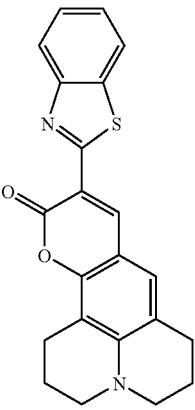 A-3
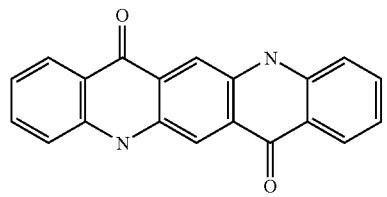 A-4
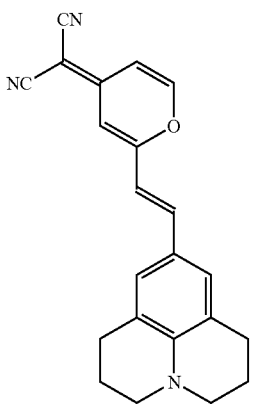 A-5
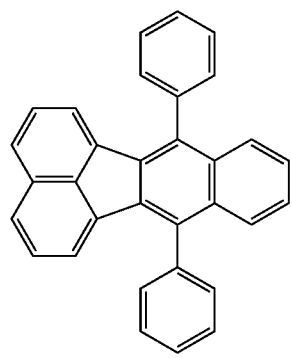 A-6
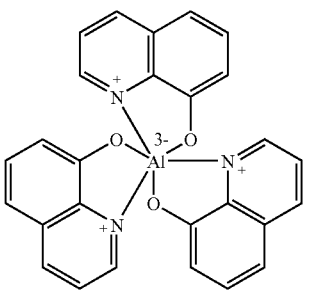 A-7
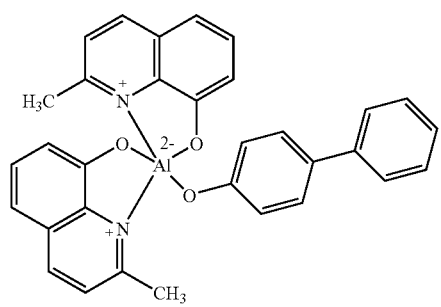 A-8

-continued
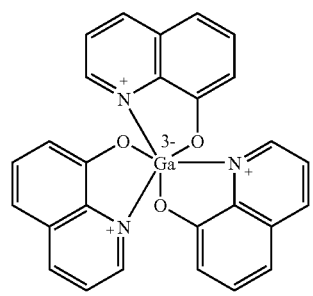
A-9
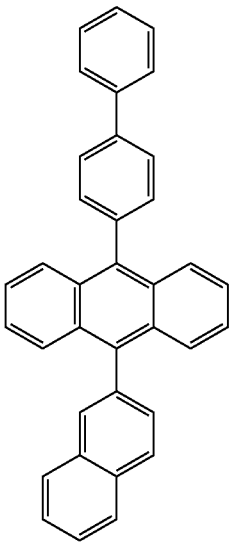
A-10
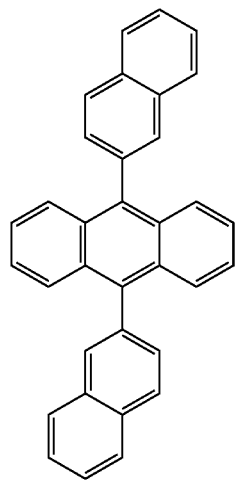
A-11
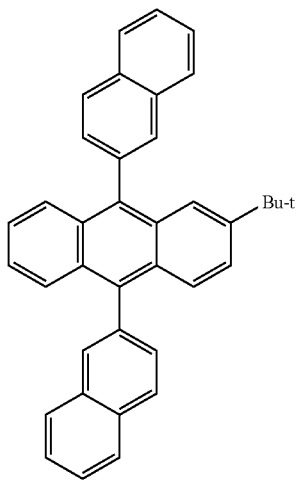
A-12
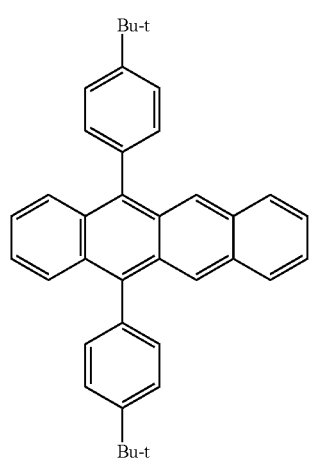
A-13
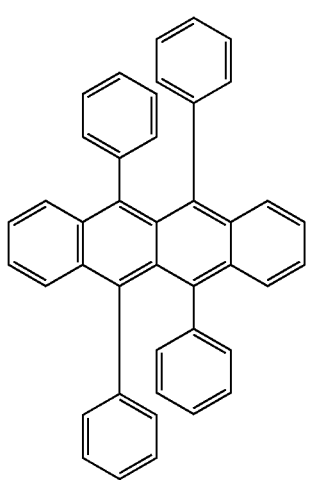
A-14

-continued
A-15
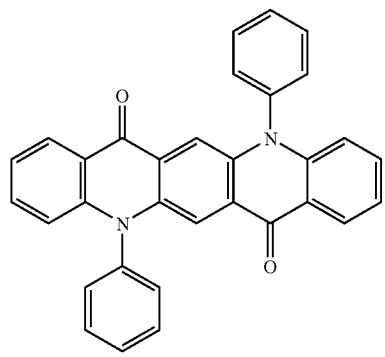
A-16
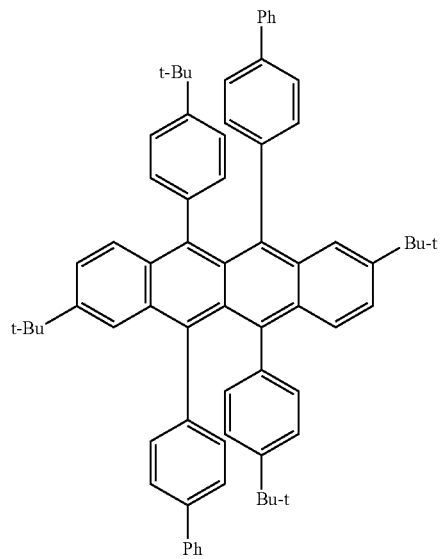
A-17
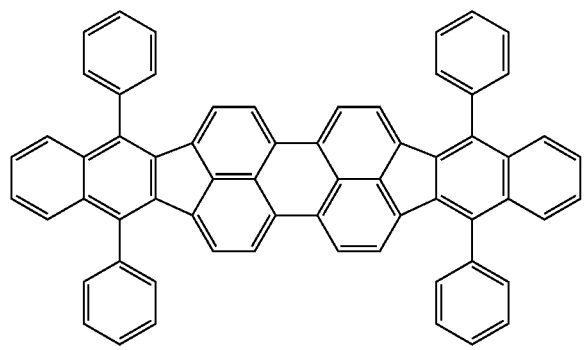
A-18
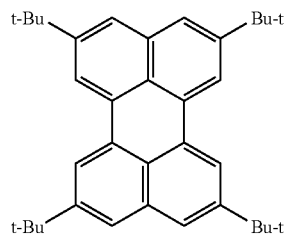
A-19
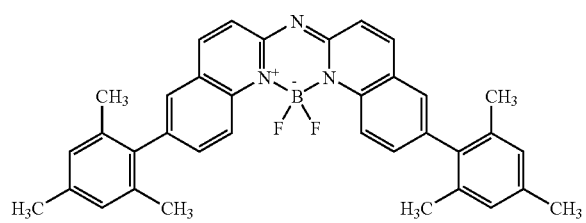
A-20
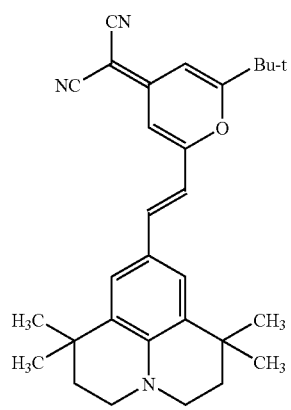

-continued
A-21
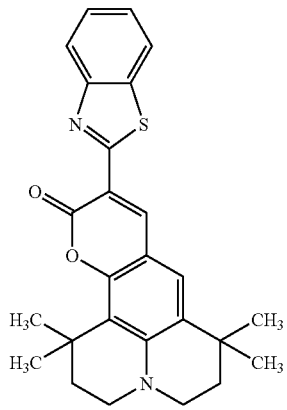
A-22
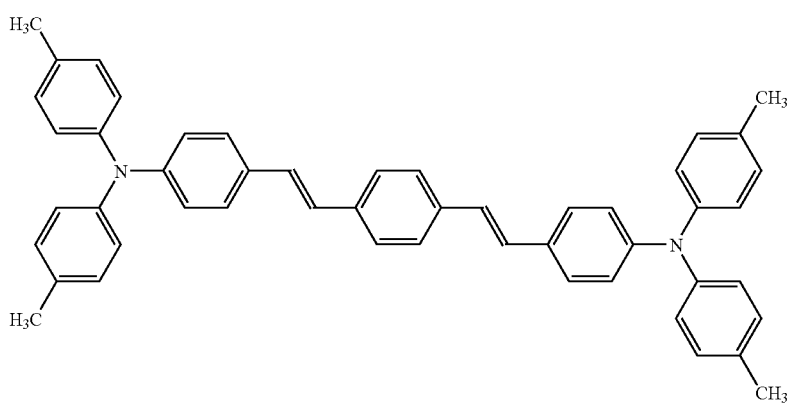
A-23
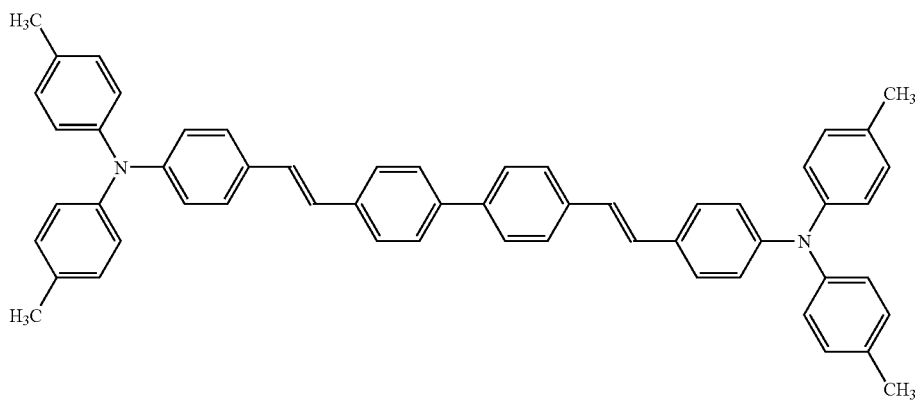
A-24 A-25
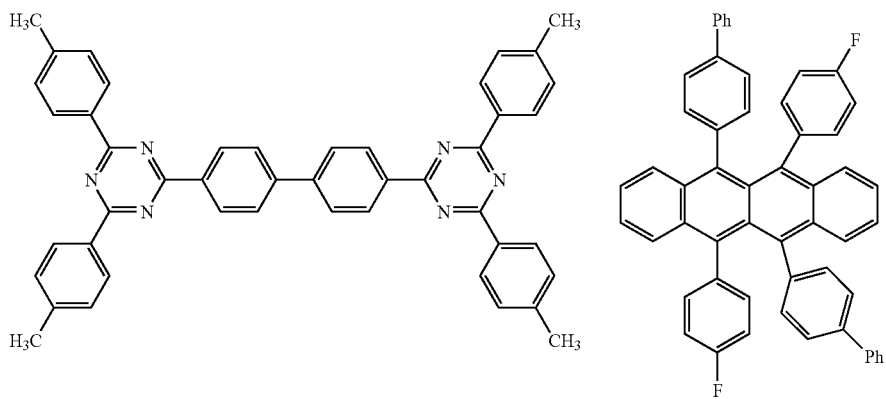

-continued
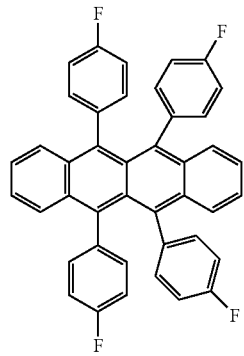
A-26
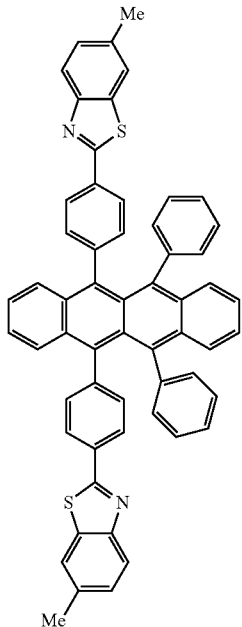
A-27
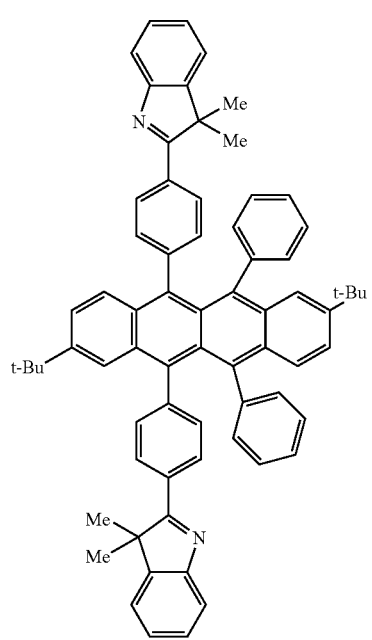
A-28
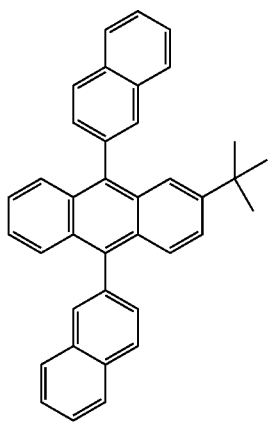
A-29

-continued
A-30
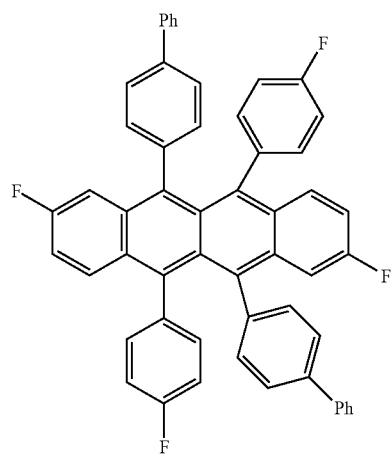
A-31
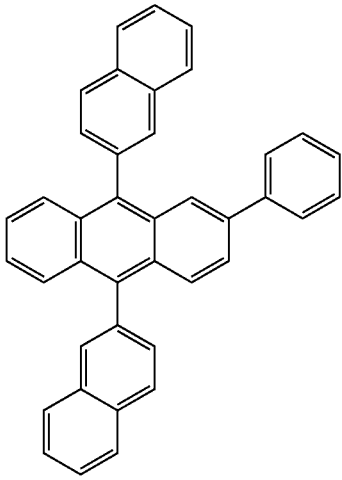
A-32
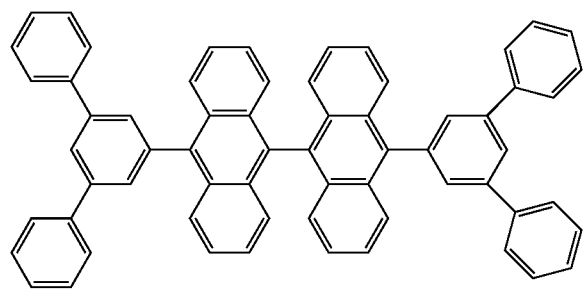
A-33
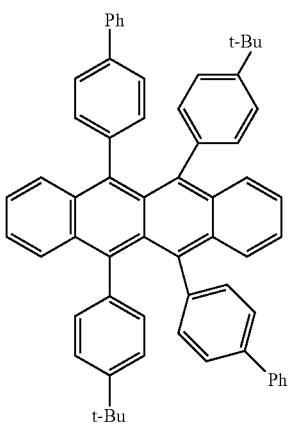
A-34
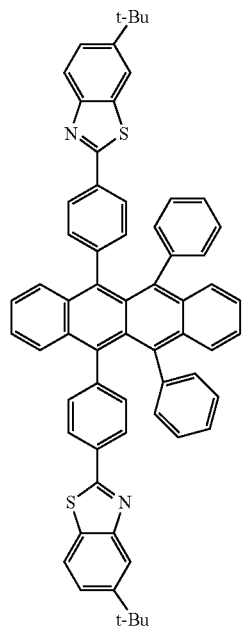
A-35
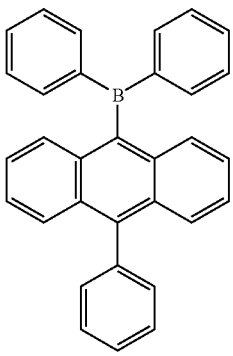

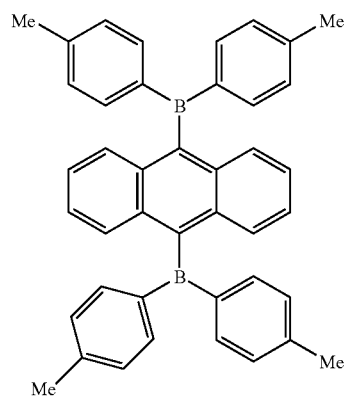
A-36
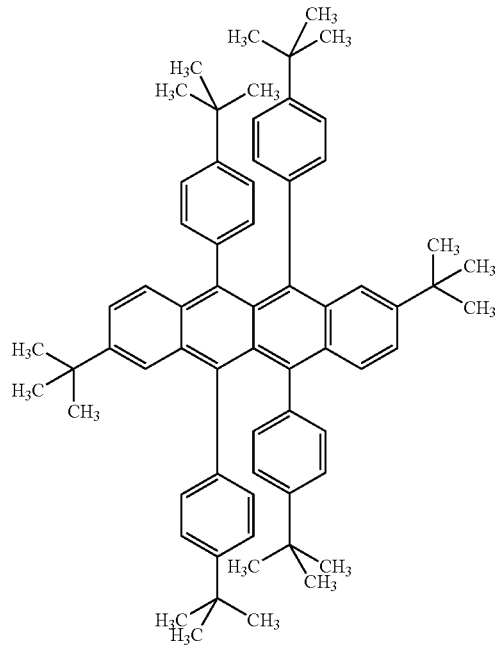
A-37
Listed below are illustrative examples of compounds that are suitable for second compounds in the electron-transporting layer.
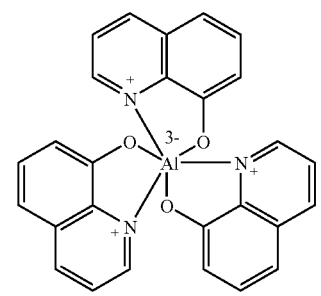
B-1
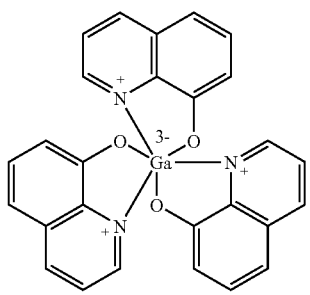
B-3
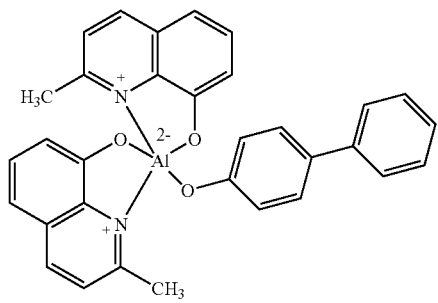
B-2
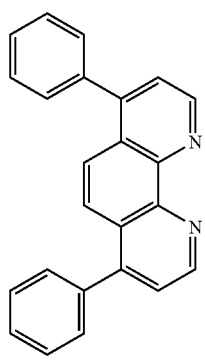
B-4

-continued

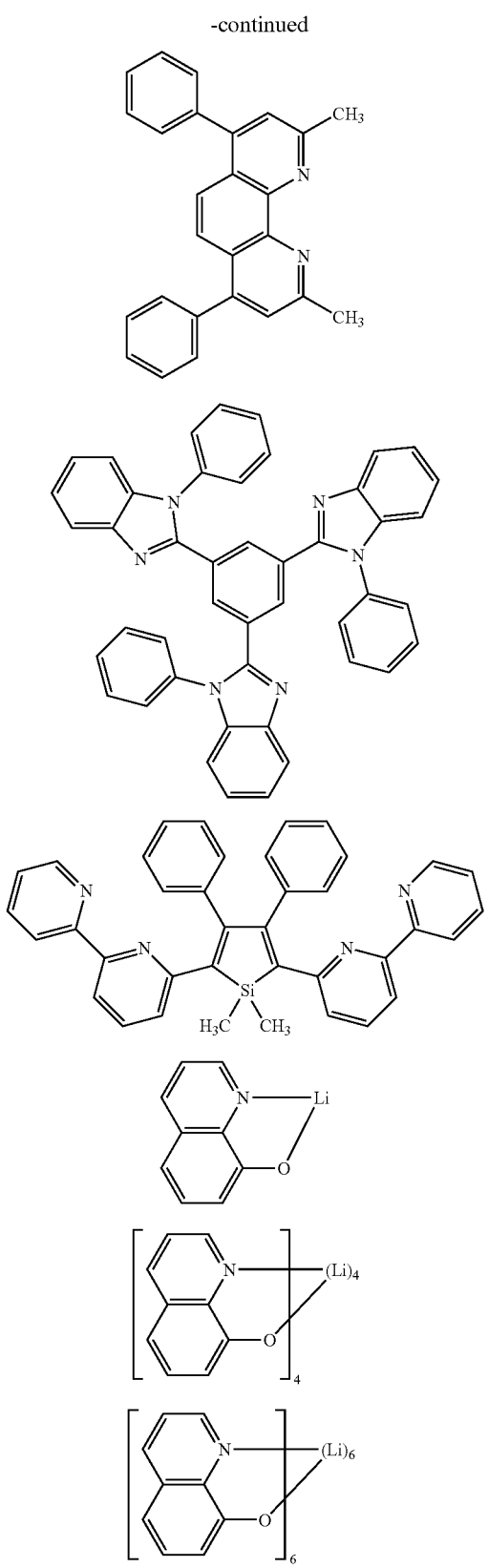

Following are the chemical names and acronyms associated with many useful compounds for practicing the invention:

A-2, perylene; A-7 or B-1, Alq or Alq$_3$, tris(8-quinolinolato) aluminum (III); A-8 or B-2, BAlq; A-9 or B-3, Gaq or Gaq$_3$, tris(8-quinolinolato)gallium(III); A-10, 9-(2-naphthyl)-10-(4-phenyl)phenylanthracene; A-11, ADN, 9,10-bis(2-naphthyl)-2-phenylanthracene; A-12, tBADN, 2-tert-butyl-9,10-bis(2-naphthyl) anthracene; A-13, tBDPN, 5,12-bis[4-tert-butylphenyl]naphthacene; A-14, rubrene, 5,6,11,12-tetraphenylnaphthacene; A-18, TBP, 2,5,8,11-tetra-tert-butylperylene; B-4, BPhen, 4,7-diphenyl-1,10-phenanthroline; B-5, BCP, 2,9-dimethyl-4,7-diphenyl-1,10-phenanthroline; B-6, TPBI, 2,2',2"-(1,3,5-benzenetriyl)tris[1-phenyl-1H-benzimidazole]; and A-24 or B-8, TRAZ, 2,2'-(1,1'-biphenyl)-4,4'-diylbis(4,6-(p-tolyl)-1,3,5-triazine). Additional examples of first and second compounds represented by Formula 5 can be found in Bryan et al., U.S. Pat. No. 5,141,671, incorporated herein by reference.

Certain materials are useful as either first or second compounds, for example, Alq, tris(8-quinolinolato)aluminum (III), structure A-7 and B-1; and Balq, bis(2-methyl-8-quinolinolato)(4-phenylphenolato)aluminum(III), structure A-8 and B-2.

Examples of preferred combinations of the invention are those wherein the first compound is selected from A-7, A-8, A-9, A-13, A-14, A-15, A-16, A-18, A-19 and A-24, and the second compounds are selected from B-1, B-2, B-3, B-4, B-5, B-6, B-7 and B-8.

The thickness of the electron-transporting layer may be between 0.5 and 200 nm, suitably between 2 and 100 nm, and desirably between 5 and 50 nm.

The light-emitting layer comprises a host and a fluorescent material. The inventive device includes a hole-blocking layer (HBL), adjacent to the LEL on the cathode side. There should be an energy barrier for hole migration from the host and the dopant in the LEL into the hole-blocking layer, while electrons should pass readily from the hole-blocking layer into the light-emitting layer. The first requirement entails that the ionization potential of the hole-blocking layer be larger than that of the light-emitting layer, suitably by at least 0.05 eV, or commonly by at least 0.1 eV, or desirably by 0.2 eV or more. The second requirement entails that the electron affinity of the hole-blocking layer not greatly exceed that of the light-emitting layer, and desirably be either less than that of light-emitting layer or not exceed that of the light-emitting layer by more than about 0.2 eV.

Another way to view this is that a suitable hole-blocking material desirably has a HOMO (Highest Occupied Molecular Orbital) energy level significantly less than that of the light-emitting layer material. Suitably, the HOMO energy level of the material of the HBL is at least 0.05 eV lower, more commonly at least 0.10 eV lower, and frequently 0.20 eV lower, desirably at least 0.50 eV, or even 0.70 eV lower than the LEL. The HOMO energy level can be determined by electrochemical methods and correlates with the first oxidation potential of the molecule. The measurement of the HOMO energy of several representative compounds is illustrated in Example 2. As described previously, the HOMO energy level of a compound can also be calculated.

In further embodiments of the invention, the hole-blocking layer comprises material represented by Formula (3), Formula (4), Formula (5), or Formula (6). These Formulas have been described in detail previously. Examples of desirable hole-blocking materials include B-1, Alq, tris(8-quinolinolato)aluminum (III); B-2, (BAlq), bis(2-methyl-8-quinolinolato)(4-phenylphenolato)aluminum(III); B-4, BPhen, 4,7-diphenyl-1,10-phenanthroline; and B-6, TPBI, 2,2',2"-(1,3,5-benzenetriyl)tris[-1-phenyl-1H-benzimidazole].

The thickness of the hole-blocking layer may be between 0.5 and 200 nm, suitably between 2 and 100 nm, commonly between 5 and 50 nm and desirably between 5 and 10 nm.

The light-emitting layer includes a fluorescent light-emitting material. As more fully described in U.S. Pat. Nos. 4,769,292 and 5,935,721, the light-emitting layer (LEL) of the organic EL element includes a luminescent material where electroluminescence is produced as a result of electron-hole pair recombination. The light-emitting layer can be comprised of a single material, but more commonly consists of a host material doped with a guest emitting material or materials where light emission comes primarily from the emitting materials and can be of any color. The host materials in the light-emitting layer can be an electron-transporting material, a hole-transporting material, or another material or combination of materials that support hole-electron recombination. Fluorescent emitting materials are typically incorporated at 0.01 to 10% by weight of the host material.

An important relationship for choosing a fluorescent material as a guest emitting material is a comparison of the excited singlet-state energies of the host and the fluorescent material. It is highly desirable that the excited singlet-state energy of the fluorescent material be lower than that of the host material. The excited singlet-state energy is defined as the difference in energy between the emitting singlet state and the ground state. For non-emissive hosts, the lowest excited state of the same electronic spin as the ground state is considered the emitting state.

Host and emitting materials known to be of use include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, and 6,020,078.

Metal complexes of 8-hydroxyquinoline and similar derivatives, also known as metal-chelated oxinoid compounds (Formula E), constitute one class of useful host compounds capable of supporting electroluminescence, and are particularly suitable for light emission of wavelengths longer than 500 nm, e.g., green, yellow, orange, and red.

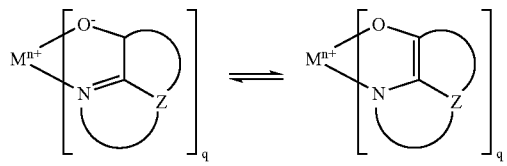

(E)

wherein

M represents a metal;

q is an integer of from 1 to 4; and

Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; a trivalent metal, such aluminum or gallium, or another metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato)aluminum(III)]

CO-2: Magnesium bisoxine [alias, bis(8-quinolinolato)magnesium(II)]

CO-3: Bis[benzo{f}-8-quinolinolato]zinc (II)

CO-4: Bis(2-methyl-8-quinolinolato)aluminum(III)-☐-oxo-bis(2-methyl-8-quinolinolato) aluminum(III)

CO-5: Indium trisoxine [alias, tris(8-quinolinolato)indium]

CO-6: Aluminum tris(5-methyloxine) [alias, tris(5-methyl-8-quinolinolato) aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato)zirconium(IV)]

Derivatives of 9,10-di-(2-naphthyl)anthracene (Formula F1) constitute one class of useful host materials capable of supporting electroluminescence, and are particularly suitable for light emission of wavelengths longer than 400 nm, e.g., blue, green, yellow, orange or red.

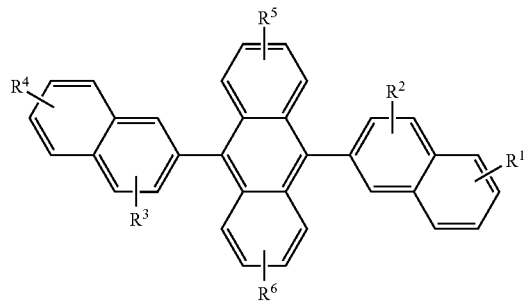

(F1)

wherein: $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl; pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Illustrative examples include 9,10-di-(2-naphthyl)anthracene and 2-t-butyl-9,10-di-(2-naphthyl)anthracene. Other anthracene derivatives can be useful as a host in the LEL, including derivatives of 9,10-bis[4-(2,2-diphenylethenyl)phenyl]anthracene.

The monoanthracene derivative of Formula (F2) is also a useful host material capable of supporting electroluminescence, and are particularly suitable for light emission of wavelengths longer than 400 nm, e.g., blue, green, yellow, orange or red. Anthracene derivatives of Formula (F3) are described in commonly assigned U.S. patent application Ser. No. 10/693,121 filed Oct. 24, 2003 (now abandoned) by Lelia Cosimbescu et al., entitled "Electroluminescent Device With Anthracene Derivative Host", the disclosure of which is herein incorporated by reference,

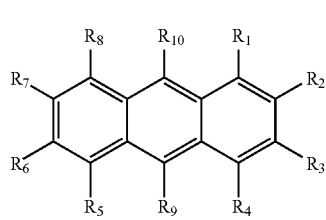

(F2)

wherein:

$R_1$-$R_8$ are H; and $R_9$ is a naphthyl group containing no fused rings with aliphatic carbon ring members; provided that $R_9$ and $R_{10}$ are not the same, and are free of amines and sulfur compounds. Suitably, $R_9$ is a substituted naphthyl group with one or more further fused rings such that it forms a fused aromatic ring system, including a phenanthryl, pyrenyl, fluoranthene, perylene, or substituted with one or more substituents including fluorine, cyano group, hydroxy, alkyl, alkoxy, aryloxy, aryl, a heterocyclic oxy group, carboxy, trimethylsilyl group, or an unsubstituted naphthyl group of two fused rings. Conveniently, $R_9$ is 2-naphthyl, or 1-naphthyl substituted or unsubstituted in the para position; and $R_{10}$ is a biphenyl group having no fused rings with aliphatic carbon ring members. Suitably $R_{10}$ is a substituted biphenyl group, such that is forms a fused aromatic ring system including but not limited to a naphthyl, phenanthryl, perylene, or substituted with one or more substituents including fluorine, cyano group, hydroxy, alkyl, alkoxy, aryloxy, aryl, a heterocyclic oxy group, carboxy, trimethylsilyl group, or an unsubstituted biphenyl group. Conveniently, $R_{10}$ is 4-biphenyl, 3-biphenyl unsubstituted or substituted with another phenyl ring without fused rings to form a terphenyl ring system, or 2-biphenyl. Particularly useful is 9-(2-naphthyl)-10-(4-biphenyl)anthracene.

Another useful class of anthracene derivatives is represented by general formula (F3)

A1--L--A2          (F3)

wherein A 1 and A 2 each represent a substituted or unsubstituted monophenyl-anthryl group or a substituted or unsubstituted diphenylanthryl group and can be the same with or different from each other and L represents a single bond or a divalent linking group.

Another useful class of anthracene derivatives is represented by general formula (F4)

A3-An-A4          (F4)

wherein An represents a substituted or unsubstituted divalent anthracene residue group, A 3 and A 4 each represent a substituted or unsubstituted monovalent condensed aromatic ring group or a substituted or unsubstituted non-condensed ring aryl group having 6 or more carbon atoms and can be the same with or different from each other.

Asymmetric anthracene derivatives as disclosed in U.S. Pat. No. 6,465,115 and WO 2004/018587 are useful hosts and these compounds are represented by general formulas (F5) and (F6) shown below, alone or as a component in a mixture

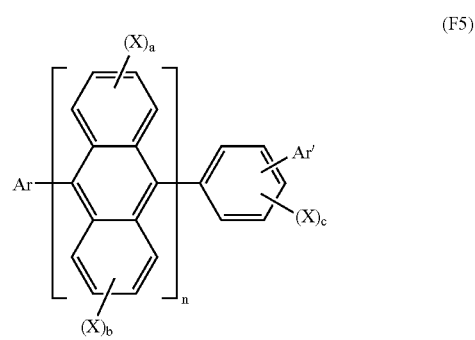

(F5)

wherein:

Ar is an (un)substituted condensed aromatic group of 10-50 nuclear carbon atoms;

Ar' is an (un)substituted aromatic group of 6-50 nuclear carbon atoms;

X is an (un)substituted aromatic group of 6-50 nuclear carbon atoms, (un)substituted aromatic heterocyclic group of 5-50 nuclear carbon atoms, (un)substituted alkyl group of 1-50 carbon atoms, (un)substituted alkoxy group of 1-50 carbon atoms, (un)substituted aralkyl group of 6-50 carbon atoms, (un)substituted aryloxy group of 5-50 nuclear carbon atoms, (un)substituted arylthio group of 5-50 nuclear carbon atoms, (un)substituted alkoxycarbonyl group of 1-50 carbon atoms, carboxy group, halogen atom, cyano group, nitro group, or hydroxy group;

a, b, and c are whole numbers of 0-4; and n is a whole number of 1-3;

and when n is 2 or more, the formula inside the parenthesis shown below can be the same or different.

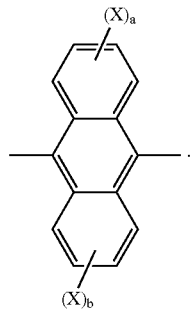

Furthermore, the present invention provides anthracene derivatives represented by general formula (F6) shown below

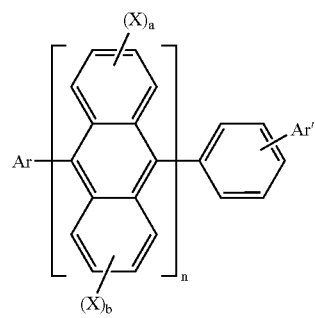

(F6)

wherein:
  Ar is an (un)substituted condensed aromatic group of 10-50 nuclear carbon atoms;
  Ar' is an (un)substituted aromatic group of 6-50 nuclear carbon atoms;
  X is an (un)substituted aromatic group of 6-50 nuclear carbon atoms, (un)substituted aromatic heterocyclic group of 5-50 nuclear carbon atoms, (un)substituted alkyl group of 1-50 carbon atoms, (un)substituted alkoxy group of 1-50 carbon atoms, (un)substituted aralkyl group of 6-50 carbon atoms, (un)substituted aryloxy group of 5-50 nuclear carbon atoms, (un)substituted arylthio group of 5-50 nuclear carbon atoms, (un)substituted alkoxycarbonyl group of 1-50 carbon atoms, carboxy group, halogen atom, cyano group, nitro group, or hydroxy group;
  a, b, and c are whole numbers of 0-4; and n is a whole number of 1-3; and
  when n is 2 or more, the formula inside the parenthesis shown below can be the same or different

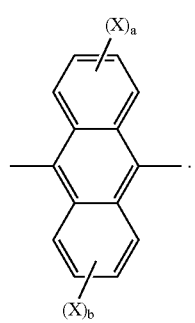

Specific examples of useful anthracene materials for use in a light-emitting layer include

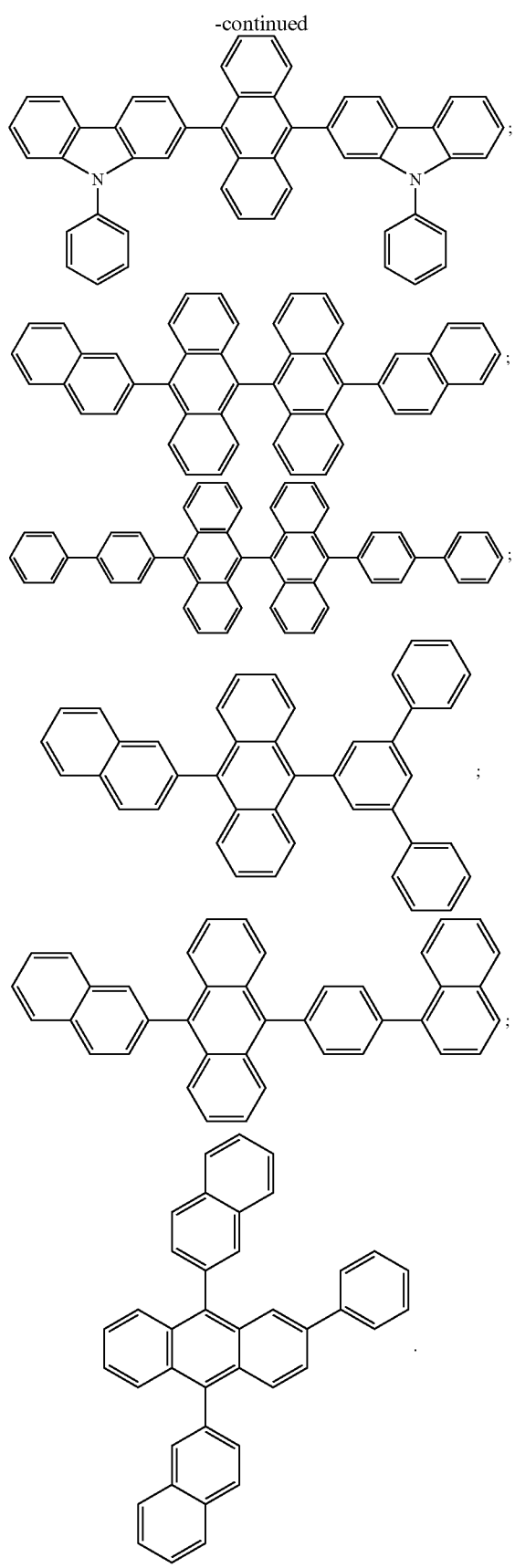

Benzazole derivatives (Formula G) constitute another class of useful host materials capable of supporting electroluminescence, and are particularly suitable for light emission of wavelengths longer than 400 nm, e.g., blue, green, yellow, orange or red.

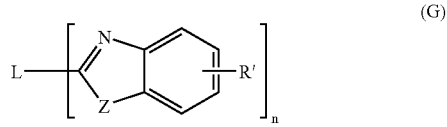

wherein:

n is an integer of 3 to 8;

Z is O, NR or S; and

R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and L is a linkage unit consisting of alkyl, aryl, substituted alkyl, or substituted aryl, which connects the multiple benzazoles together. L may be either conjugated with the multiple benzazoles or not in conjugation with them. An example of a useful benzazole is 2,2',2"-(1,3,5-phenylene)tris[1-phenyl-1H-benzimidazole].

Styrylarylene derivatives as described in U.S. Pat. No. 5,121,029 and JP 08333569 are also useful hosts for blue emission. For example, 9,10-bis[4-(2,2-diphenylethenyl)phenyl]anthracene and 4,4'-bis(2,2-diphenylethenyl)-1,1'-biphenyl (DPVBi) are useful hosts for blue emission.

Useful fluorescent emitting materials include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrylium and thiapyrylium compounds, fluorene derivatives, periflanthene derivatives, indenoperylene derivatives, bis(azinyl)imine boron compounds, bis(azinyl)methene compounds, and carbostyryl compounds. Illustrative examples of useful materials include, but are not limited to, the following:

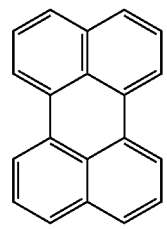 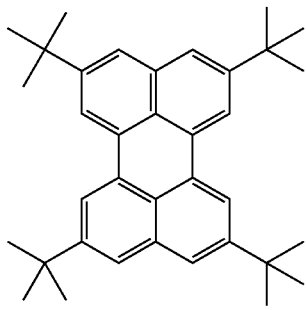

L1        L2

-continued

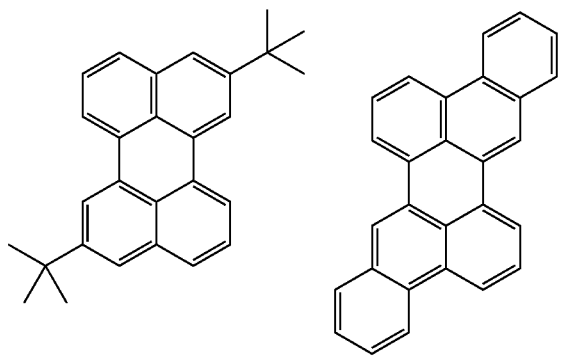

L3            L4

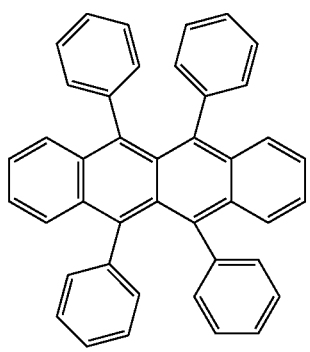

L5

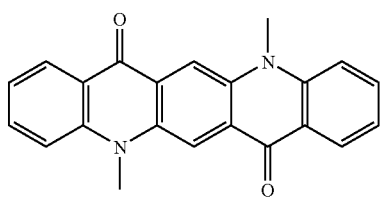

L6

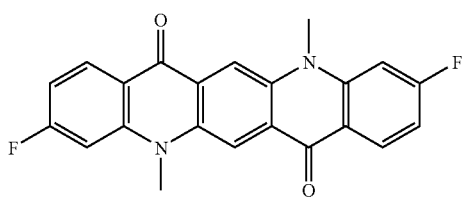

L7

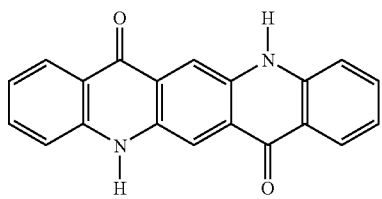

L8

-continued

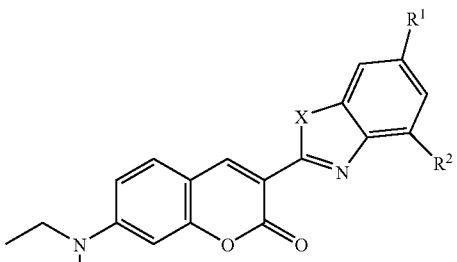

| | X | R1 | R2 |
|---|---|---|---|
| L9  | O | H      | H      |
| L10 | O | H      | Methyl |
| L11 | O | Methyl | H      |
| L12 | O | Methyl | Methyl |
| L13 | O | H      | t-butyl |
| L14 | O | t-butyl | H     |
| L15 | O | t-butyl | t-butyl |
| L16 | S | H      | H      |
| L17 | S | H      | Methyl |
| L18 | S | Methyl | H      |
| L19 | S | Methyl | Methyl |
| L20 | S | H      | t-butyl |
| L21 | S | t-butyl | H     |
| L22 | S | t-butyl | t-butyl |

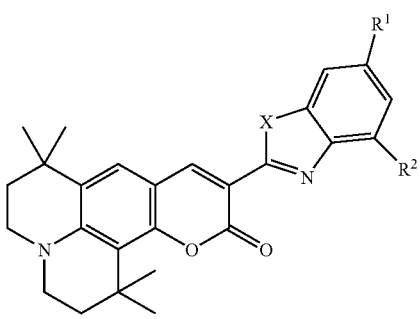

| | X | R1 | R2 |
|---|---|---|---|
| L23 | O | H      | H      |
| L24 | O | H      | Methyl |
| L25 | O | Methyl | H      |
| L26 | O | Methyl | Methyl |
| L27 | O | H      | t-butyl |
| L28 | O | t-butyl | H     |
| L29 | O | t-butyl | t-butyl |
| L30 | S | H      | H      |
| L31 | S | H      | Methyl |
| L32 | S | Methyl | H      |
| L33 | S | Methyl | Methyl |
| L34 | S | H      | t-butyl |
| L35 | S | t-butyl | H     |
| L36 | S | t-butyl | t-butyl |

-continued
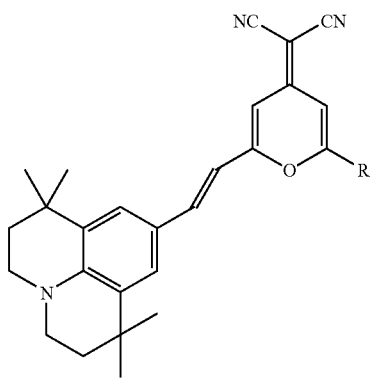
| | R |
|---|---|
| L37 | phenyl |
| L38 | methyl |
| L39 | t-butyl |
| L40 | mesityl |
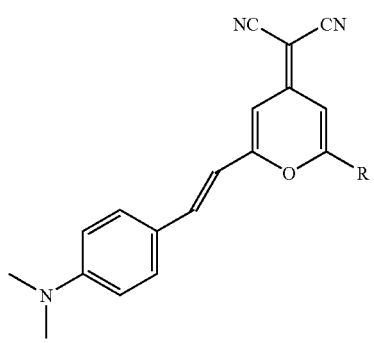
| | R |
|---|---|
| L41 | phenyl |
| L42 | methyl |
| L43 | t-butyl |
| L44 | mesityl |
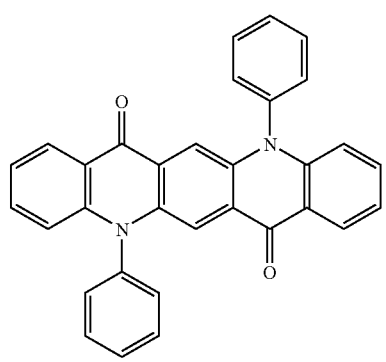
L45
-continued
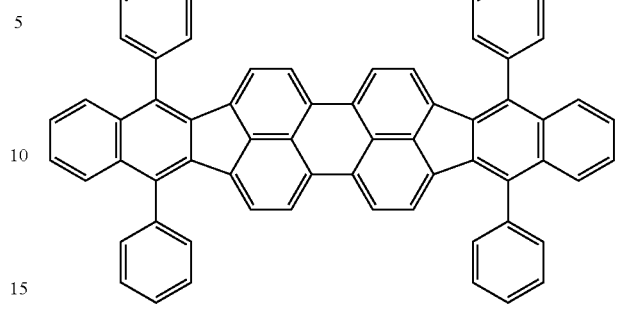
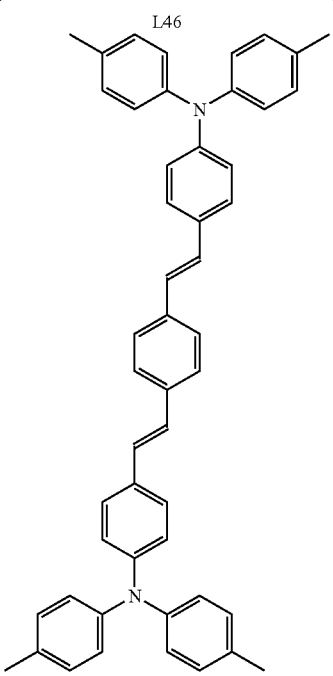
L46
L47
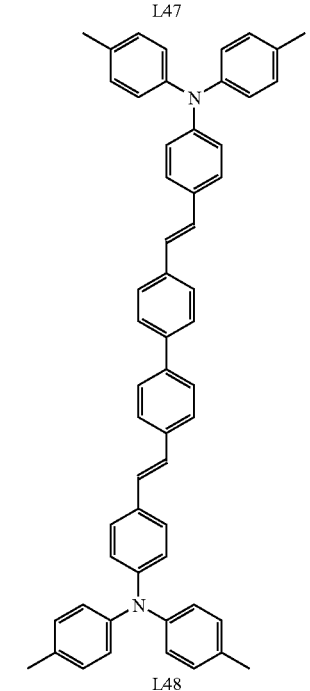
L48

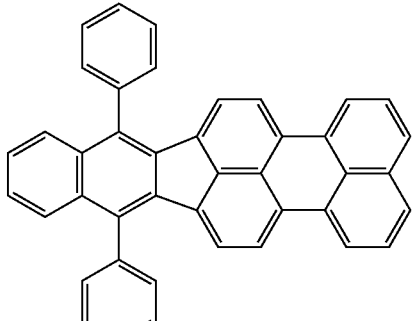

L49

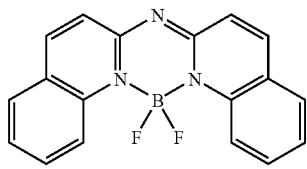

L50

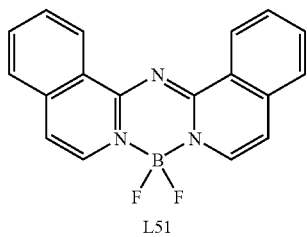

L51

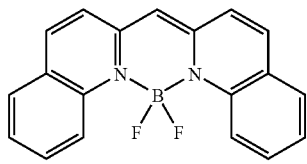

L52

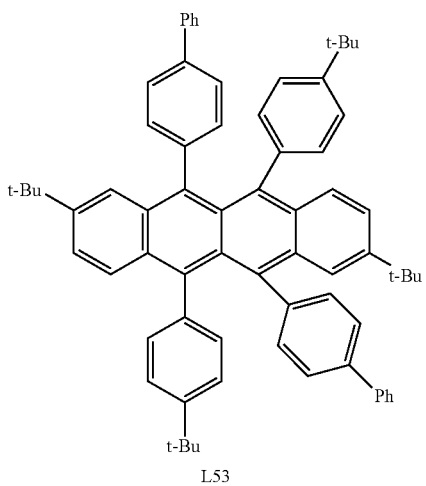

L53

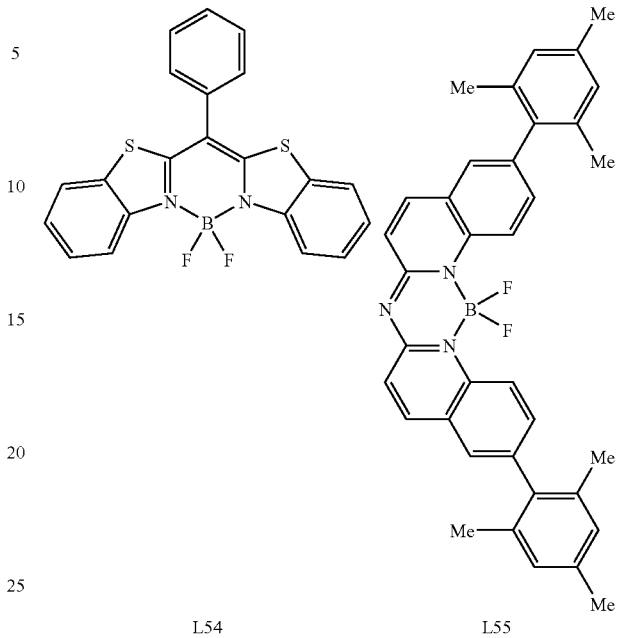

L54  L55

Unless otherwise specifically stated, use of the term "substituted" or "substituent" means any group or atom other than hydrogen. Unless otherwise provided, when a group, compound or formula containing a substitutable hydrogen is referred to, it is also intended to encompass not only the substituent's unsubstituted form, but also its form further substituted with any substituent group or groups as herein mentioned, so long as the substituent does not destroy properties necessary for device utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy) propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N- dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropylsulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur, phosphorous, or boron. Such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

General Device Architecture

The present invention can be employed in many EL device configurations using small molecule materials, oligomeric materials, polymeric materials, or combinations thereof. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the present invention can be successfully practiced. The essential requirements of an OLED are an anode, a cathode, and an organic light-emitting layer located between the anode and cathode. Additional layers may be employed as more fully described hereafter.

A typical structure according to the present invention and especially useful for a small molecule device, is shown in the Figure and is comprised of a substrate 101, an anode 103, a hole-injecting layer 105, a hole-transporting layer 107, a light-emitting layer 109, an electron-transporting layer 111, an electron injecting layer 112, and a cathode 113. These layers are described in detail below. Note that the substrate 101 may alternatively be located adjacent to the cathode 113, or the substrate 101 may actually constitute the anode 103 or cathode 113. The organic layers between the anode 103 and cathode 113 are conveniently referred to as the organic EL element. Also, the total combined thickness of the organic layers is desirably less than 500 nm. If the device includes phosphorescent material, a hole-blocking layer, located between the light-emitting layer and the electron-transporting layer, may be present.

The anode 103 and cathode 113 of the OLED are connected to a voltage/current source 150 through electrical conductors 160. The OLED is operated by applying a potential between the anode 103 and cathode 113 such that the anode 103 is at a more positive potential than the cathode 113. Holes are injected into the organic EL element from the anode 103 and electrons are injected into the organic EL element at the cathode 113. Enhanced device stability can sometimes be achieved when the OLED is operated in an AC mode where, for some time period in the AC cycle, the potential bias is reversed and no current flows. An example of an AC driven OLED is described in U.S. Pat. No. 5,552,678.

Substrate

The OLED device of this invention is typically provided over a supporting substrate 101 where either the cathode 113 or anode 103 can be in contact with the substrate. The electrode in contact with the substrate 101 is conveniently referred to as the bottom electrode. Conventionally, the bottom electrode is the anode 103, but this invention is not limited to that configuration. The substrate 101 can either be light transmissive or opaque, depending on the intended direction of light emission. The light transmissive property is desirable for viewing the EL emission through the substrate 101. Transparent glass or plastic is commonly employed in such cases. The substrate 101 can be a complex structure comprising multiple layers of materials. This is typically the case for active matrix substrates wherein TFTs are provided below the OLED layers. It is still necessary that the substrate 101, at least in the emissive pixelated areas, be comprised of largely transparent materials such as glass or polymers. For applications where the EL emission is viewed through the top electrode, the transmissive characteristic of the bottom support is immaterial, and therefore the substrate can be light transmissive, light absorbing or light reflective. Substrates for use in this case include, but are not limited to, glass, plastic, semiconductor materials such as silicon, ceramics, and circuit board materials. Again, the substrate 101 can be a complex structure comprising multiple layers of materials such as found in active matrix TFT designs. It is necessary to provide in these device configurations a light-transparent top electrode.

Anode

When the desired electroluminescent light emission (EL) is viewed through the anode, the anode 103 should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode 103. For applications where EL emission is viewed only through the cathode 113, the transmissive characteristics of the anode 103 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize short circuits or enhance reflectivity.

Cathode

When light emission is viewed solely through the anode 103, the cathode 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One useful cathode material is comprised of a Mg:Ag alloy wherein the percentage of silver is in the range of 1 to 20%, as described in U.S. Pat. No. 4,885,221. Another suitable class of cathode materials includes bilayers comprising the cathode and a thin electron-injection layer (EIL) in contact with an organic layer (e.g., an electron transporting layer (ETL)), the cathode being capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. An ETL material doped with an alkali metal, for example, Li-doped Alq, is another example of a useful EIL. Other useful cathode material sets include, but are not limited to, those disclosed in U.S. Pat. Nos. 5,059,861, 5,059,862, and 6,140,763.

When light emission is viewed through the cathode, the cathode 113 must be transparent or nearly transparent. For such applications, metals must be thin or one must use transparent conductive oxides, or a combination of these materials. Optically transparent cathodes have been described in more detail in U.S. Pat. Nos. 4,885,211, 5,247,190, JP 3,234,963, U.S. Pat. Nos. 5,703,436, 5,608,287, 5,837,391, 5,677,572, 5,776,622, 5,776,623, 5,714,838, 5,969,474, 5,739,545, 5,981,306, 6,137,223, 6,140,763, 6,172,459, EP 1 076 368, U.S. Pat. Nos. 6,278,236, and 6,284,3936. Cathode materials are typically deposited by any suitable method such as evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Hole-Injecting Layer (HIL)

A hole-injecting layer 105 may be provided between anode 103 and hole-transporting layer 107. The hole-injecting layer can serve to improve the film formation property of subsequent organic layers and to facilitate injection of holes into the hole-transporting layer 107. Suitable materials for use in the hole-injecting layer 105 include, but are not limited to, porphyrinic compounds as described in U.S. Pat. No. 4,720,432, plasma-deposited fluorocarbon polymers as described in U.S. Pat. No. 6,208,075, and some aromatic amines, for example, MTDATA (4,4',4"-tris[(3-methylphenyl)phenylamino]triphenylamine). Alternative hole-injecting materials reportedly useful in organic EL devices are described in EP 0 891 121 A1 and EP 1 029 909 A1. A hole-injection layer is conveniently used in the present invention, and is desirably a plasma-deposited fluorocarbon polymer. The thickness of a hole-injection layer containing a plasma-deposited fluorocarbon polymer can be in the range of 0.2 nm to 15 nm and suitably in the range of 0.3 to 1.5 nm.

Hole-Transporting Layer (HTL)

While not always necessary, it is often useful to include a hole-transporting layer in an OLED device. The hole-transporting layer 107 of the organic EL device contains at least one hole-transporting compound such as an aromatic tertiary amine. An aromatic tertiary amine is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. pat. No. 3,180,730. Other suitable triarylamines substituted with one or more vinyl radicals and/or comprising at least one active hydrogen containing group are disclosed by Brantley et al U.S. Pat. Nos. 3,567,450 and 3,658,520.

A more preferred class of aromatic tertiary amines is those which include at least two aromatic tertiary amine moieties as described in U.S. Pat. Nos. 4,720,432 and 5,061,569. Such compounds include those represented by structural formula (A).

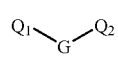

A wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

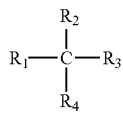

where
R₁ and R₂ each independently represents a hydrogen atom, an aryl group, or an alkyl group or R₁ and R₂ together represent the atoms completing a cycloalkyl group; and
R₃ and R₄ each independently represents an aryl group, which is in turn substituted with a diaryl substituted amino group, as indicated by structural formula (C):

wherein R₅ and R₆ are independently selected aryl groups. In one embodiment, at least one of R₅ or R₆ contains a polycyclic fused ring structure, e.g., a naphthalene.

Another class of aromatic tertiary amines is the tetraaryldiamines. Desirable tetraaryldiamines include two diarylamino groups, such as indicated by formula (C), linked through an arylene group. Useful tetraaryldiamines include those represented by formula (D).

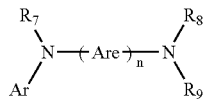

wherein
each Are is an independently selected arylene group, such as a phenylene or anthracene moiety,
n is an integer of from 1 to 4, and
Ar, R₇, R₈, and R₉ are independently selected aryl groups.
In a typical embodiment, at least one of Ar, R₇, R₈, and R₉ is a polycyclic fused ring structure, e.g., a naphthalene.

The various alkyl, alkylene, aryl, and arylene moieties of the foregoing structural formulae (A), (B), (C), (D), can each in turn be substituted. Typical substituents include alkyl groups, alkoxy groups, aryl groups, aryloxy groups, and halide such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single tertiary amine compound or a mixture of such compounds. Specifically, one may employ a triarylamine, such as a triarylamine satisfying the formula (B), in combination with a tetraaryldiamine, such as indicated by formula (D). Illustrative of useful aromatic tertiary amines are the following:

1,1-Bis(4-di-p-tolylaminophenyl)cyclohexane (TAPC)
1,1-Bis(4-di-p-tolylaminophenyl)-4-methylcyclohexane
1,1-Bis(4-di-p-tolylaminophenyl)-4-phenylcyclohexane
1,1-Bis(4-di-p-tolylaminophenyl)-3-phenylpropane (TAPPP)
N,N,N',N'-tetraphenyl-4,4'''-diamino-1,1':4',1":4",1'''-quaterphenyl
Bis(4-dimethylamino-2-methylphenyl)phenylmethane
1,4-bis[2-[4-[N,N-di(p-toly)amino]phenyl]vinyl]benzene (BDTAPVB)
N,N,N',N'-Tetra-p-tolyl-4,4'-diaminobiphenyl (TTB)
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl (NPB)
4,4'-Bis[N-(1-naphthyl)-N-(2-naphthyl)amino]biphenyl (TNB)
4,4'-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4'-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
2,6-Bis[N,N-di(2-naphthyl)amino]fluorene
4,4',4"-tris[(3-methylphenyl)phenylamino]triphenylamine (MTDATA)
4,4'-Bis[N-(3-methylphenyl)-N-phenylamino]biphenyl (TPD)

Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS. It is also possible for the hole-transporting layer to comprise two or more sublayers of differing compositions, the composition of each sublayer being as described above. The thickness of the hole-transporting layer can be between 10 and about 500 nm and suitably between 50 and 300 nm.

Light-Emitting Layer (LEL)

The light-emitting layer has been described previously. However, more than one light-emitting layer may be present. If present, the second LEL may include a fluorescent or a phosphorescent light-emitting material. For convenience, the phosphorescent complex guest material may be referred to herein as a phosphorescent material. The phosphorescent material typically includes one or more ligands, for example monoanionic ligands that can be coordinated to a metal through an $sp^2$ carbon and a heteroatom. Conveniently, the ligand can be phenylpyridine (ppy) or derivatives or analogs thereof. Examples of some useful phosphorescent organometallic materials include tris(2-phenylpyridinato-N,C²')iridium(III), bis(2-phenylpyridinato-N,C²')iridium(III)(acetylacetonate), and bis(2-phenylpyridinato-N,C²')platinum(II). Usefully, many phosphorescent organometallic materials emit in the green region of the spectrum, that is, with a maximum emission in the range of 510 to 570 nm.

Phosphorescent materials may be used singly or in combinations other phosphorescent materials, either in the same or different layers. Phosphorescent materials and suitable hosts are described in WO 00/57676, WO 00/70655, WO 01/41512 A1, WO 02/15645 A1, US 2003/0017361 A1, WO 01/93642 A1, WO 01/39234 A2, U.S. Pat. No. 6,458,475 B1, WO 02/071813 A1, U.S. Pat. No. 6,573,651 B2, US 2002/0197511 A1, WO 02/074015 A2, U.S. Pat. No. 6,451,455 B1, US 2003/0072964 A1, US 2003/0068528 A1, U.S. Pat. No. 6,413,656 B1, 6,515,298 B2, 6,451,415 B1, 6,097,147, US 2003/0124381 A1, US 2003/0059646 A1, US 2003/0054198 A1, EP 1 239 526 A2, EP 1 238 981 A2, EP 1 244 155 A2, US 2002/0100906 A1, US 2003/0068526 A1, US 2003/0068535 A1, JP 2003073387A, JP 2003 073388A, US 2003/0141809 A1, US 2003/0040627 A1, JP 2003059667A, JP 2003073665A, and US 2002/0121638 A1.

The emission wavelengths of cyclometallated Ir(III) complexes of the type $IrL_3$ and $IrL_2L'$, such as the green-emitting fac-tris(2-phenylpyridinato-N,C²')iridium(III) and bis(2-phenylpyridinato-N,C²')iridium(III)(acetylacetonate) may be shifted by substitution of electron donating or withdrawing groups at appropriate positions on the cyclometallating ligand L, or by choice of different heterocycles for the cyclometallating ligand L. The emission wavelengths may also be shifted by choice of the ancillary ligand L'. Examples of red emitters are the bis(2-(2'-benzothienyl)pyridinato-N,C³')iridium(III)(acetylacetonate) and tris(2-phenylisoquinolinato-N,C)iridium(III). A blue-emitting example is bis(2-(4,6-difluorophenyl)-pyridinato-N,C²')iridium(III)(picolinate).

Red electrophosphorescence has been reported, using bis (2-(2'-benzo[4,5-a]thienyl)pyridinato-N, C³) iridium (acetylacetonate) [$Btp_2Ir(acac)$] as the phosphorescent material (C. Adachi, S. Lamansky, M. A. Baldo, R. C. Kwong, M. E. Thompson, and S. R. Forrest, App. Phys. Lett., 78, 1622-1624 (2001)).

Other important phosphorescent materials include cyclometallated Pt(II) complexes such as cis-bis(2-phenylpyridinato-N,C²')platinum(II), cis-bis(2-(2'-thienyl)pyridinato-N, C³') platinum(II), cis-bis(2-(2'-thienyl)quinolinato-N,C⁵') platinum(II), or (2-(4,6-difluorophenyl)pyridinato-N,C²') platinum (II) (acetylacetonate). Pt (II) porphyrin complexes such as 2,3,7,8,12,13,17,18-octaethyl-21H, 23H-porphine platinum(II) are also useful phosphorescent materials.

Still other examples of useful phosphorescent materials include coordination complexes of the trivalent lanthanides such as $Tb^{3+}$ and $Eu^{3+}$ (J. Kido et al., Appl. Phys. Lett., 65, 2124 (1994)).

Suitable host materials for phosphorescent materials should be selected so that transfer of a triplet exciton can occur efficiently from the host material to the phosphorescent material but cannot occur efficiently from the phosphorescent material to the host material. Therefore, it is highly desirable that the triplet energy of the phosphorescent material be lower than the triplet energy of the host. Generally speaking, a large triplet energy implies a large optical bandgap. However, the band gap of the host should not be chosen so large as to cause an unacceptable barrier to injection of charge carriers into the light-emitting layer and an unacceptable increase in the drive voltage of the OLED. Suitable host materials are described in WO 00/70655 A2; 01/39234 A2; 01/93642 A1; 02/074015 A2; 02/15645 A1, and US 20020117662. Suitable hosts include certain aryl amines, triazoles, indoles and carbazole compounds. Examples of desirable hosts are 4,4'-N,N'-dicarbazole-biphenyl, otherwise known as 4,4'-bis(carbazol-9-yl) biphenyl or CBP; 4,4'-N,N'-dicarbazole-2,2'-dimethyl-biphenyl, otherwise known as 2,2'-dimethyl-4,4'-bis(carbazol-9-yl)biphenyl or CDBP; 1,3-bis(N,N'-dicarbazole)benzene, otherwise known as 1,3-bis(carbazol-9-yl)benzene, and poly (N-vinylcarbazole), including their derivatives.

Desirable host materials are capable of forming a continuous film.

Hole-Blocking Layer (HBL)

The hole-blocking layer 110 of the device has been described previously. However, in certain cases, it may be desirable to have more than one HBL present. If a light-emitting layer includes a phosphorescent material, it is further desirable, but not absolutely required, that the triplet energy of the hole-blocking material be greater than that of the phosphorescent material. Suitable hole-blocking materials are described in WO 00/70655A2 and WO 01/93642 A1. Two examples of useful hole-blocking materials are bathocuproine (BCP) and bis(2-methyl-8-quinolinolato)(4-phenylphenolato)aluminum(III) (BAlq). The characteristic luminescence of BCP is in the ultraviolet, and that of BAlq is blue. Metal complexes other than BAlq are also known to block holes and excitons as described in US 20030068528. In addition, US 20030175553 A1 describes the use of fac-tris(1-phenylpyrazolato-N,C²')iridium(III) (Irppz) for this purpose.

Electron-Transporting Layer (ETL)

The electron-transporting layer has been described previously. In other embodiments it may be desirable to have additional electron-transporting layers as described below.

Desirable thin film-forming materials for use in forming an additional electron-transporting layer of organic EL devices are metal-chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary of contemplated oxinoid compounds are those satisfying structural formula (E), previously described.

Other electron-transporting materials suitable for use in the electron-transporting layer include various butadiene derivatives as disclosed in U.S. Pat. No. 4,356,429 and various heterocyclic optical brighteners as described in U.S. Pat. No. 4,539,507. Benzazoles satisfying structural formula (G) are also useful electron transporting materials. Triazines are also known to be useful as electron transporting materials.

Electron-Injecting Layer (EIL)

An electron-injecting layer, when present, includes those described in U.S. Pat. Nos. 5,608,287; 5,776,622; 5,776,623; 6,137,223; and 6,140,763, the disclosures of which are incorporated herein by reference. An electron-injecting layer generally consists of a material having a work function less than 4.0 eV. A thin-film containing low work-function alkaline metals or alkaline earth metals, such as Li, Cs, Ca, Mg can be employed. In addition, an organic material doped with these low work-function metals can also be used effectively as the electron-injecting layer. Examples are Li- or Cs-doped Alq. In one suitable embodiment the electron-injecting layer includes LiF. In practice, the electron-injecting layer is often a thin layer deposited to a suitable thickness in a range of 0.1-3.0 nm Other Useful Organic Layers and Device Architecture It also known in the art that emitting materials may be included in the hole-transporting layer 107. In that case, the hole-transporting material may serve as a host. Multiple materials may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, US 20020025419, EP 1 182 244, U.S. Pat. Nos. 5,683,823, 5,503,910, 5,405,709, and 5,283,182 and can be equipped with a suitable filter arrangement to produce a color emission.

This invention may be used in so-called stacked device architecture, for example, as taught in U.S. Pat. Nos. 5,703, 436 and 6,337,492.

Deposition of Organic Layers

The organic materials mentioned above are suitably deposited through sublimation, but can be deposited from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,851,709 and 6,066,357) and inkjet method (U.S. Pat. No. 6,066,357).

Organic materials useful in making OLEDs, for example organic hole-transporting materials, organic light-emitting materials doped with an organic electroluminescent components have relatively complex molecular structures with relatively weak molecular bonding forces, so that care must be taken to avoid decomposition of the organic material(s) during physical vapor deposition. The aforementioned organic materials are synthesized to a relatively high degree of purity, and are provided in the form of powders, flakes, or granules. Such powders or flakes have been used heretofore for placement into a physical vapor deposition source wherein heat is applied for forming a vapor by sublimation or vaporization of the organic material, the vapor condensing on a substrate to provide an organic layer thereon.

Several problems have been observed in using organic powders, flakes, or granules in physical vapor deposition: These powders, flakes, or granules are difficult to handle. These organic materials generally have a relatively low physical density and undesirably low thermal conductivity, particularly when placed in a physical vapor deposition source which is disposed in a chamber evacuated to a reduced pressure as low as $10^{-6}$ Torr. Consequently, powder particles, flakes, or granules are heated only by radiative heating from a heated source, and by conductive heating of particles or flakes directly in contact with heated surfaces of the source. Powder particles, flakes, or granules which are not in contact with heated surfaces of the source are not effectively heated by conductive heating due to a relatively low particle-to-particle contact area; This can lead to nonuniform heating of such organic materials in physical vapor deposition sources. Therefore, result in potentially nonuniform vapor-deposited organic layers formed on a substrate.

These organic powders can be consolidated into a solid pellet. These solid pellets consolidating into a solid pellet from a mixture of a sublimable organic material powder are easier to handle. Consolidation of organic powder into a solid pellet can be accomplished with relatively simple tools. A solid pellet formed from mixture comprising one or more non-luminescent organic non-electroluminescent component materials or luminescent electroluminescent component materials or mixture of non-electroluminescent component and electroluminescent component materials can be placed into a physical vapor deposition source for making organic layer. Such consolidated pellets can be used in a physical vapor deposition apparatus.

In one aspect, the present invention provides a method of making an organic layer from compacted pellets of organic materials on a substrate, which will form part of an OLED.

One preferred method for depositing the materials of the present invention is described in US 2004/0255857 and U.S. Ser. No. 10/945,941 now U.S. Pat. No. 7,288,286 where different source evaporators are used to evaporate each of the materials of the present invention. A second preferred method involves the use of flash evaporation where materials are metered along a material feed path in which the material feed path is temperature controlled. Such a preferred method is described in the following co-assigned patent applications: U.S Ser. Nos. 10/784,585; 10/805,980; 10/945,940; 10/945, 941; 11/050,924; and 11/050,934 now U.S. Pat. Nos. 7,232, 588; 7,238,389; 7,288,285; 7,288,286; publication No. 2006/ 0177576; and U.S. Pat. No. 7,165,340, respectively. Using this second method, each material may be evaporated using different source evaporators or the solid materials may be mixed prior to evaporation using the same source evaporator.

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as $SiO_x$, Teflon, and alternating inorganic/polymeric layers are known in the art for encapsulation. Any of these methods of sealing or encapsulation and desiccation can be used with the EL devices constructed according to the present invention.

Optical Optimization

OLED devices of this invention can employ various well-known optical effects in order to enhance their emissive properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color-conversion filters over the display. Filters, polarizers, and anti-glare or anti-reflection coatings may be specifically provided over the EL device or as part of the EL device.

Embodiments of the invention may provide advantageous features such as higher luminous yield, lower drive voltage, and higher power efficiency, longer operating lifetimes or ease of manufacture. Embodiments of devices useful in the invention can provide a wide range of hues including those useful in the emission of white light (directly or through filters to provide multicolor displays). Embodiments of the invention can also provide an area lighting device.

The invention and its advantages are further illustrated by the specific examples that follow. Unless otherwise specified, the term "percentage" or "percent" and the symbol "%" of a material indicate the volume percent of the material in the layer in which it is present.

EXAMPLE 1

Synthesis of A-37

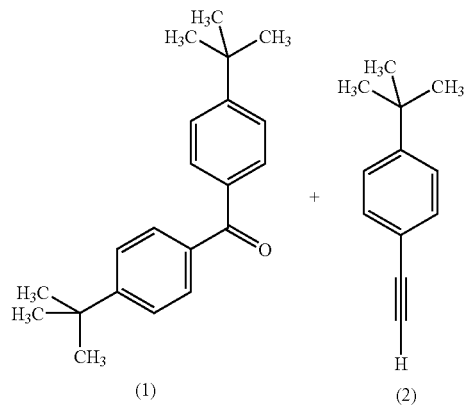

(eq. 1)

(1)      (2)

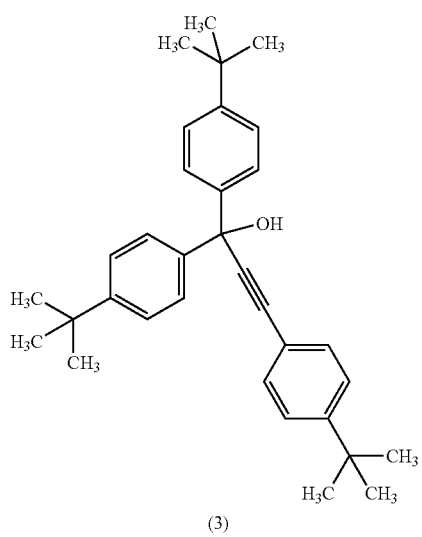

(3)

$$(3) \xrightarrow[\text{2. collidine/xylenes}]{\text{1. CH}_3\text{SO}_2\text{Cl/CH}_2\text{Cl}_2/\text{NEt}_3} \quad (\text{eq. 2})$$

-continued

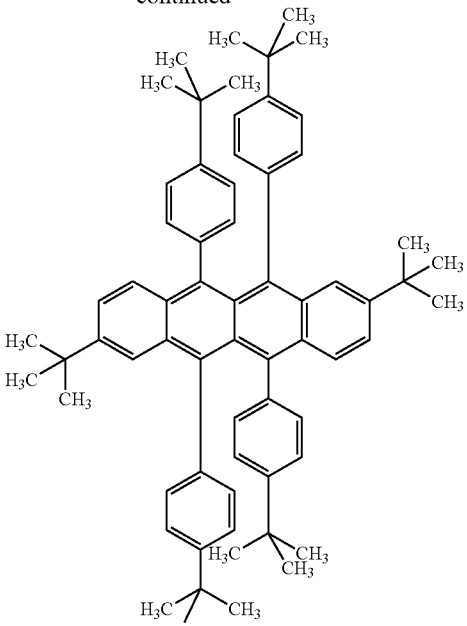

A-37

Compound (3), eq. 1, was prepared in the following manner: Under a nitrogen atmosphere, acetylenic compound (2) (2.0 g, 12 mMole), was dissolved in dimethylformamide (DMF) (100 mL) and the solution cooled to 0° C. Potassium t-butoxide (KBu$^t$O) (1.4 g, 12 mMole), was added and the mixture stirred well for approximately 15 minutes. To this mixture was then added the benzophenone (1) (3.53 g, 30 mMole). Stirring was continued at 0° C. for approximately 30 minutes and then allowed to come to room temperature over a 1-hour period. At the end of this time the solution was cooled to 0° C. and the reaction treated with saturated sodium chloride (20 mL). The mixture was then diluted with ethyl acetate, washed with 2N-HCl (3 times), dried over MgSO$_4$, filtered and concentrated under reduced pressure. The crude product was triturated with petroleum ether to give the product as an off-white solid. The yield of compound (3) was 3.0 g.

Compound (3) (7.0 g, 15 mMole) was dissolved in methylene chloride (CH$_2$Cl$_2$) (70 mL), and stirred at 0° C. under a nitrogen atmosphere. To this solution was added triethylamine (NEt$_3$) (1.56 g, 15 mMole) and then the mixture was treated drop by drop with methanesulfonyl chloride (CH$_3$SO$_2$Cl) (1.92 g, 15 mMole), keeping the temperature of the reaction in the range 0-5° C. After the addition, the solution was stirred at 020 0 C. for 30 minutes, and then allowed to warm to room temperature over 1 hour. The reaction was then heated to reflux, distilling off the methylene chloride solvent. The methylene chloride solvent was gradually replaced by adding xylenes (a total of 70 mL). When the internal temperature of the reaction reached 80° C., collidine (2.40 g, 19.82 mMole), dissolved in xylenes (10 mL) was added drop by drop over a 10-minute period. The temperature was then raised to 110° C. and held at this temperature for 4 hours. After this period the reaction was cooled and concentrated under reduced pressure. The oily residue was stirred with methanol (70 mL) to give the crude product. This material was filtered off, washed with methanol and petroleum ether to give compound A-37 as a bright red solid. The yield was 1.5 g and A-37 had a melting point of 300-305° C. The product may be further purified by sublimation (250° C. @ 200 millitorr) with a $N_2$ carrier gas.

EXAMPLE 2

Determination of LUMO and HOMO Values

A comparison of the LUMO values of the first and second compounds in the layer of the invention should be carefully considered. To obtain a drive voltage reduction over devices that contain only a first compound or only a second compound, it is desirable that there is a difference in the LUMO values of the compounds. The first compound should have a lower LUMO (more negative) value than the second compound, or compounds.

Additionally, a comparison of the HOMO values of the hole-blocking material and the material in the light-emitting layer should be considered carefully. To obtain effective hole blocking it is desirable that there is a difference between the HOMO values of the LEL and HBL materials.

The LUMO and HOMO values are typically determined experimentally by electrochemical methods. A Model CHI660 electrochemical analyzer (CH Instruments, Inc., Austin, Tex.) was employed to carry out the electrochemical measurements. Cyclic voltammetry (CV) and Osteryoung square-wave voltammetry (SWV) were used to characterize the redox properties of the compounds of interest. A glassy carbon (GC) disk electrode (A=0.071 $cm^2$) was used as working electrode. The GC electrode was polished with 0.05 μm alumina slurry, followed by sonication cleaning in Milli-Q deionized water twice and rinsed with acetone in between water cleaning. The electrode was finally cleaned and activated by electrochemical treatment prior to use. A platinum wire served as counter electrode and a saturated calomel electrode (SCE) was used as a quasi-reference electrode to complete a standard 3-electrode electrochemical cell. Ferrocene (Fc) was used as an internal standard ($E_{Fc}$=0.50 V vs. SCE in 1:1 acetonitrile/toluene, 0.1 M TBAF). A mixture of acetonitrile and toluene (50%/50% v/v, or 1:1) was used as the organic solvent system. The supporting electrolyte, tetrabutylammonium tetraflouroborate (TBAF) was recrystallized twice in isopropanol and dried under vacuum. All solvents used were low water grade (<20 ppm water). The testing solution was purged with high purity nitrogen gas for approximately 5 minutes to remove oxygen and a nitrogen blanket was kept on the top of the solution during the course of the experiments. All measurements were performed at ambient temperature of 25±1° C. The oxidation and reduction potentials were determined either by averaging the anodic peak potential (Ep,a) and cathodic peak potential (Ep,c) for reversible or quasi-reversible electrode processes or on the basis of peak potentials (in SWV) for irreversible processes. All LUMO and HOMO values pertaining to this application are calculated from the following:

Formal reduction potentials vs. SCE for reversible or quasi-reversible processes;

$$E^{o'}_{red}=(E_{pa}+E_{pc})/2$$

$$E^{o'}_{ox}=(E_{pa}+E_{pc})/2$$

Formal reduction potentials vs. Fc;

$$E^{o'}_{red} \text{ vs. } Fc=(E^{o'}_{red} \text{ vs. } SCE)-E_{Fc}$$

$$E^{o'}_{ox} \text{ vs. } Fc=(E^{o'}_{ox} \text{ vs. } SCE)-E_{Fc}$$

where $E_{Fc}$ is the oxidation potential $E_{ox}$, of ferrocene;

Estimated lower limit for LUMO and HOMO values;

$$LUMO=HOMO_{Fc}-(E^{o'}_{red} \text{ vs. } Fc)$$

$$HOMO=HOMO_{Fc}-(E^{o'}_{ox} \text{ vs. } Fc)$$

where $HOMO_{Fc}$(Highest Occupied Molecular Orbital for ferrocene)=−4.8 eV.

The LUMO values for some first and second compounds are listed in Table 1a. To make a selection of compounds useful in the invention, the first compound should have a lower LUMO value than its paired second compound(s).

TABLE 1a

LUMO Values for Representative Materials

| Material | LUMO (eV) |
| --- | --- |
| A-7 (B-1) | −2.50 |
| A-8 (B-2) | −2.50 |
| A-10 | −2.44 |
| A-11 | −2.45 |
| A-12 | −2.40 |
| A-13 | −2.77 |
| A-14 | −2.83 |
| A-15 | −3.02 |
| A-16 | −2.72 |
| A-17 | −3.24 |
| A-18 | −2.52 |
| A-19 | −2.83 |
| A-22 | −2.35 |
| B-4 | −2.4 |
| B-5 | −2.3 |
| B-6 | −2.3 |
| B-10 | −1.85 |

The HOMO values for representative materials are listed in Table 1b. As described previously, materials used for the hole-blocking layer desirably have a HOMO energy level less than that of the material of the light-emitting layer. For example, a light-emitting layer commonly used in an EL device would include an anthracene host, such as A-10, and a fluorescent dopant like A-18. One can see that the other materials in Table 1b have a lower (more negative) HOMO value relative to this host and dopant combination, especially B-4, B-5, and B-6, and hence they would make good hole-blocking materials for a light-emitting layer composed of A-10 and A-18.

TABLE 1b

HOMO Values for Representative Materials

| Material | HUMO (eV) |
| --- | --- |
| A-7 (B-1) | −5.65 |
| A-8 (B-2) | −5.7 |
| A-10 | −5.61 |
| A-18 | −5.28 |
| B-4 | −6.1 |
| B-5 | −6.1 |
| B-6 | −6.0 |

EXAMPLE 3

Determination of Low-Voltage Electron Transport Materials

Materials were tested to determine if they were low voltage electron transport materials by incorporating them alone into the electron-transporting layer of a device. Devices were constructed in the following manner.

A glass substrate coated with an 21.5 nm layer of indium-tin oxide (ITO) as the anode was sequentially ultrasonicated in a commercial detergent, rinsed in deionized water, degreased in toluene vapor and exposed to oxygen plasma for about 1 min.
  a) Over the ITO was deposited a 1 nm fluorocarbon ($CF_x$) hole-injecting layer (HIL) by plasma-assisted deposition of $CHF_3$.
  b) A hole-transporting layer (HTL) of N,N'-di-1-naphthalenyl-N,N'-diphenyl-4,4'-diaminobiphenyl (NPB) having a thickness of 75 nm was then evaporated onto a).
  c) A 35 nm light-emitting layer (LEL) of tris(8-quinolinolato)aluminum (III) (Alq) was then deposited onto the hole-transporting layer.
  d) A 35 nm electron-transporting layer (ETL) of the materials to be tested was then deposited onto the light-emitting layer.
  e) On top of the ETL was deposited a 0.5 nm layer of LiF.
  f) On top of the LiF layer was deposited a 130 nm layer of Al to form the cathode.

The above sequence completed the deposition of the EL device. The device was then hermetically packaged in a dry glove box for protection.

Low voltage electron transport materials are materials that when incorporated alone into the electron-transporting layer, as described above, result in test voltages of 16 volts or less. Low voltage electron transport materials with test voltages of 13 volts, or 12 volts, or 11 volts, or more suitably 10 volts or less are desirable as second compounds of the invention while materials of 9 or 8 volts or less are preferred as second compounds. Materials tested for low drive voltages and the results are shown in Table 2.

TABLE 2

Examples of Low Voltage Electron Transport Materials

| Sample | Material | Type | Voltage (V) | Relative Voltage[1] |
|---|---|---|---|---|
| 3-1 | B-1 (Alq) | Low | 8.0 | 100 |
| 3-2 | B-5 | Low | 9.9 | 124 |
| 3-3 | B-6 | Low | 8.3 | 104 |
| 3-4 | A-10 | Low | 13.7 | 171 |
| 3-5 | A-13 | Low | 15.4 | 192 |
| 3-6 | A-18 | High | 16.5 | 206 |
| 3-7 | B-10 | Low | 12.1 | 151 |

[1]Voltage relative to B-1 (Alq)

Table 2 shows that compound A-18 does not qualify as low voltage electron transport materials.

In one embodiment, low voltage electron transport materials have a test voltage, when examined in the manner shown in Example 3, no more than 100% higher than Alq, suitably no more than 60% higher and desirably no more than 25% higher than Alq.

EXAMPLE 4

Fabrication of Comparative Devices 1-1 and 1-2 with No HBL

An EL device (1-1) was constructed in the following manner.
  1. A glass substrate coated with an 21.5 nm layer of indium-tin oxide (ITO), as the anode, was sequentially ultrasonicated in a commercial detergent, rinsed in deionized water, degreased in toluene vapor and exposed to oxygen plasma for about 1 min.
  2. Over the ITO was deposited a 1 nm fluorocarbon (CFx) hole-injecting layer (HIL) by plasma-assisted deposition of $CHF_3$ as described in U.S. Pat. No. 6,208,075.
  3. Next a layer of hole-transporting material 4,4'-Bis[N-(1-naphthyl)-N-phenylamino]biphenyl (NPB) was deposited to a thickness of 75 nm.
  4. A 20 nm light-emitting layer (LEL) corresponding to 94% 9-(4-biphenyl)-10-(2-naphthyl)anthracene, 6% of NPB, and 2% of 2,5,8,11-tetra-t-butylperylene was then deposited.
  5. A 35 nm electron-transporting layer (ETL) of B-1 (Alq) was vacuum-deposited over the LEL.
  6. 0.5 nm layer of lithium fluoride was vacuum deposited onto the ETL, followed by a 150 nm layer of aluminum, to form a cathode layer.

The above sequence completes the deposition of the EL device. The device is then hermetically packaged in a dry glove box for protection against ambient environment.

Device 1-2 was constructed in exactly the same manner as device 1-1, except the Alq in the ETL was replaced with or a mixture of 75% A-16 and 25% of B-1 (Alq).

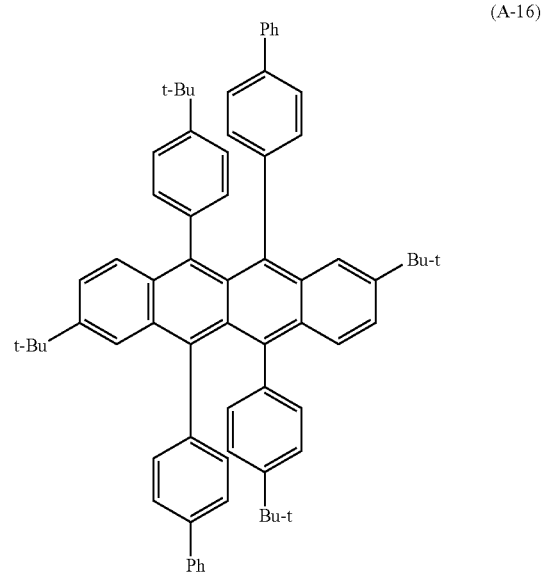

(A-16)

The devices thus formed were tested for efficiency (W/A), at an operating current of 20 mA/cm² and the results are reported in Table 3. Device efficiency is the radiant flux (in watts) produced by the device per amp of input current, where radiant flux is the light energy produced by the device per unit time.

The color of light produced by each device, in CIEx, CIEy (Commission Internationale de L'Eclairage) coordinates, is also listed in Table 3. In order to minimize experimental error, the drive voltage reported for each example is the average value obtained on testing four devices that were constructed in an identical fashion.

TABLE 3

Data for comparative device 1-1 and 1-2, Example 4.

| Device | Example | 1st ETL Cpd | Level % | 2nd ETL Cpd | Level % | Device Efficiency (W/A) | CIEx | Δ CIEx[1] | CIEy | Volt[2] (V) | Δ Volt[1] (V) |
|---|---|---|---|---|---|---|---|---|---|---|---|
| 1-1 | Comparison | B-1 | 100 | — | — | 0.074 | 0.142 | — | 0.207 | 7.7 | — |
| 1-2 | Comparison | A-16 | 75 | B-1 | 25 | 0.074 | 0.165 | 16% | 0.205 | 7.1 | −8% |

[1]Change relative to device 1-1.
[2]Average voltage of four devices.

It can be seen from Table 3 that using a mixture of compounds in the ETL reduces drive voltage by 8%. However, the color of light produced by the device is changed considerably, as can be seen by comparing the CIEx coordinates of Device 1-1 and 1-2. The color produced by Device 1-2 is not as blue as Device 1-1.

EXAMPLE 5

Fabrication of Devices 2-1 Through 2-8

A series of EL devices (2-1 through 2-8) were constructed in the following manner.

1. A glass substrate coated with an 21.5 nm layer of indium-tin oxide (ITO), as the anode, was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) hole-injecting layer (HIL) by plasma-assisted deposition of $CHF_3$ as described in U.S. Pat. No. 6,208,075.
3. Next a layer of hole-transporting material 4,4'-Bis[N-(1-naphthyl)-N-phenylamino]biphenyl (NPB) was deposited to a thickness of 75 nm.
4. A 20 nm light-emitting layer (LEL) corresponding to 94% 9-(4-biphenyl)-10-(2-naphthyl)anthracene, 6% of NPB, and 2% of 2,5,8,11-tetra-t-butylperylene was then deposited.
5. Next a layer of hole-blocking material (HBL) was deposited (see Table 4a for material and thickness).
6. An electron-transporting layer (ETL) of B-1 (Alq) or a mixture of 75% A-16 and 25% of B-1 (see Table 4a for material and thickness) was deposited over the hole-blocking layer.
7. 0.5 nm layer of lithium fluoride was vacuum deposited onto the ETL, followed by a 150 nm layer of aluminum, to form a cathode layer.

The above sequence completes the deposition of the EL device. The device is then hermetically packaged in a dry glove box for protection against ambient environment.

TABLE 4a

Device Material for Device 2-1 through 2-8, Example 5.

| Device | Example | HBL Cpd[1] | HBL (nm) | 1st ETL Cpd | Level % | 2nd ETL Cpd | Level % | ETL (nm) |
|---|---|---|---|---|---|---|---|---|
| 2-1 | Comparison | Alq | 5 | — | 0 | B-1 | 100 | 30 |
| 2-2 | Invention | Alq | 5 | A-16 | 75 | B-1 | 25 | 30 |
| 2-3 | Invention | Alq | 10 | A-16 | 75 | B-1 | 25 | 25 |
| 2-4 | Comparison | TPBI | 5 | — | 0 | B-1 | 100 | 30 |
| 2-5 | Invention | TPBI | 5 | A-16 | 75 | B-1 | 25 | 30 |
| 2-6 | Comparison | TPBI | 10 | — | 0 | B-1 | 100 | 25 |
| 2-7 | Invention | TPBI | 10 | A-16 | 75 | B-1 | 25 | 25 |
| 2-8 | Invention | A-10 | 5 | A-16 | 75 | B-1 | 25 | 30 |

[1]TPBI is 2,2',2''-(1,3,5-benzenetriyl)tris[1-phenyl-1H-benzimidazole], A-10 is 9-(2-naphthyl)-10-(4-phenyl)phenylanthracene.

The devices thus formed were tested for efficiency at an operating current of 20 mA/cm² and the results are reported in Table 4b. The color of light the devices produced in CIEx, CIEy coordinates is also reported in Table 4b. In order to minimize experimental error, the drive voltage reported for each example is the average value obtained on testing four devices that were constructed in an identical fashion.

TABLE 4b

Testing Results for Device 2-1 through 2-8, Example 5.

| Device | Example | Device Efficiency (W/A) | CIEx | Δ CIEx[1] | CIEy | Volt[2] (V) | Δ Volt[1] (V) |
|---|---|---|---|---|---|---|---|
| 2-1 | Comparison | 0.066 | 0.144 | 0% | 0.210 | 7.7 | — |
| 2-2 | Invention | 0.065 | 0.155 | +8% | 0.200 | 6.3 | −18% |
| 2-3 | Invention | 0.066 | 0.148 | +3% | 0.202 | 6.4 | −17% |
| 2-4 | Comparison | 0.071 | 0.137 | −5% | 0.191 | 8.0 | +4% |
| 2-5 | Invention | 0.056 | 0.146 | +1% | 0.191 | 7.1 | −8% |
| 2-6 | Comparison | 0.069 | 0.136 | −6% | 0.189 | 7.6 | −1% |
| 2-7 | Invention | 0.060 | 0.140 | −3% | 0.190 | 7.5 | −3% |
| 2-8 | Invention | 0.072 | 0.148 | +3% | 0.195 | 6.8 | −12% |

[1]Relative to device 2-1.
[2]Average voltage of four devices.

As illustrated in Table 4b, incorporating a hole-blocking layer and an ETL of the desired mixed compounds in the device allows one to obtain a reduced voltage while maintaining excellent color characteristics.

EXAMPLE 6

Fabrication of Devices 3-1 Through 3-4

A series of EL devices (3-1 through 3-4) were constructed in the following manner.

1. A glass substrate coated with an 21.5 nm layer of indium-tin oxide (ITO), as the anode, was sequentially ultrasonicated in a commercial detergent, rinsed in deionized water, degreased in toluene vapor and exposed to oxygen plasma for about 1 min.

2. Over the ITO was deposited a 1 nm fluorocarbon (CFx) hole-injecting layer (HIL) by plasma-assisted deposition of $CHF_3$ as described in U.S. Pat. No. 6,208,075.
3. Next a layer of hole-transporting material 4,4'-Bis[N-(1-naphthyl)-N-phenylamino]biphenyl (NPB) was deposited to a thickness of 75 nm.
4. A 20 nm light-emitting layer (LEL) corresponding to 94% 9-(4-biphenyl)-10-(2-naphthyl)anthracene, 6% of NPB, and 2% of 2,5,8,11-tetra-t-butylperylene was then deposited.
5. Next a layer of hole-blocking material (HBL) was deposited (see Table 5a for material and thickness).
6. An electron-transporting layer (ETL) of B-1 or a mixture of 75% A-16 and 25% of B-1 (see Table 5a for material and thickness) was deposited over the hole-blocking layers.
8. 0.5 nm layer of lithium fluoride was vacuum deposited onto the ETL, followed by a 150 nm layer of aluminum, to form a cathode layer.

The above sequence completes the deposition of the EL device. The device is then hermetically packaged in a dry glove box for protection against ambient environment.

TABLE 5a

Device Material for Device 3-1 through 3-4, Example 6.

| Device | Example | HBL Cpd[1] | HBL (nm) | 1st ETL Cpd | Level % | 2nd ETL Cpd | Level % | ETL (nm) |
|---|---|---|---|---|---|---|---|---|
| 3-1 | Comparison | Bphen | 5 | — | 0 | B-1 | 100 | 30 |
| 3-2 | Invention | Bphen | 5 | A-16 | 75 | B-1 | 25 | 30 |
| 3-3 | Comparison | Bphen | 10 | — | 0 | B-1 | 100 | 25 |
| 3-4 | Invention | Bphen | 10 | A-16 | 75 | B-1 | 75 | 25 |

[1]Bphen is 4,7-diphenyl-1,10-phenanthroline or bathophenanthroline.

The devices thus formed were tested for efficiency at an operating current of 20 mA/cm² and the results are reported in Table 5b. The color of light the devices produced in CIEx, CIEy coordinates is also reported in Table 5b. In order to minimize experimental error, the drive voltage reported for each example is the average value obtained on testing four devices that were constructed in an identical fashion.

TABLE 5b

Testing Results for Device 3-1 through 3-4, Example 6.

| Device | Example | Device Efficiency (W/A) | CIEx | Δ CIEx[1] | CIEy | Volt[2] (V) | Δ Volt[1] (V) |
|---|---|---|---|---|---|---|---|
| 3-1 | Comparison | 0.089 | 0.135 | 0% | 0.214 | 9.0 | 0% |
| 3-2 | Invention | 0.085 | 0.139 | +4% | 0.208 | 8.2 | −9% |
| 3-3 | Comparison | 0.087 | 0.134 | 0% | 0.213 | 8.9 | −1% |
| 3-4 | Invention | 0.089 | 0.137 | +2% | 0.209 | 8.5 | −6% |

[1]Relative to device 3-1.
[2]Average voltage of four devices.

As can be seen from Table 5b, a device incorporating both an ETL of a mixture of two compounds and a hole-blocking layer provides reduced voltage while maintaining excellent color characteristics.

EXAMPLE 7

Fabrication of Devices 4-1 and 4-2

EL devices 4-1 and 4-2 were constructed in the following manner.

1. A glass substrate coated with an 21.5 nm layer of indium-tin oxide (ITO), as the anode, was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) hole-injecting layer (HIL) by plasma-assisted deposition of $CHF_3$ as described in U.S. Pat. No. 6,208,075.
3. Next a layer of hole-transporting material 4,4'-Bis[N-(1-naphthyl)-N-phenylamino]biphenyl (NPB) was deposited to a thickness of 75 nm.
4. A 20 nm light-emitting layer (LEL) corresponding to 94% 9-(4-biphenyl)-10-(2-naphthyl)anthracene, 6% of NPB, and 2% of 2,5,8,11-tetra-t-butylperylene was then deposited.
5. Next a layer of hole-blocking material (HBL) was deposited (see Table 6a for material and thickness).
6. An electron-transporting layer (ETL) of Alq or a mixture of 75% A-16 and 25% of B-1 (see Table 6a for material and thickness) was deposited over the hole-blocking layers.
7. 0.5 nm layer of lithium fluoride was vacuum deposited onto the ETL, followed by a 150 nm layer of aluminum, to form a cathode layer.

The above sequence completes the deposition of the EL device. The device is then hermetically packaged in a dry glove box for protection against ambient environment.

TABLE 6a

Device Material for Device 4-1 and 4-2, Example 6.

| Device | Example | HBL Cpd[1] | HBL (nm) | 1st ETL Cpd | Level % | 2nd ETL Cpd | Level % | ETL (nm) |
|---|---|---|---|---|---|---|---|---|
| 4-1 | Comparison | BCP | 5 | — | | B-1 | 100 | 30 |
| 4-2 | Invention | BCP | 5 | A-16 | 75 | B-1 | 25 | 30 |

[1]BCP is 2,9-dimethyl-4,7-diphenyl-1,10-phenanthroline or bathocuproine.

The devices thus formed were tested for efficiency at an operating current of 20 mA/cm² and the results are reported in Table 6b. The color of light the devices produced in CIEx, CIEy coordinates is also reported in Table 6b.

The operational stability of each device was determined by operating the device at a current density of 20 mA/cm² for a period of 100 h, while the device was in a chamber held at a temperature of 70° C. The stability results are reported in Table 6c as the percent luminance output of the cell after testing relative to the initial luminance before testing.

TABLE 6b

Testing Results for Device 4-1 and 4-2, Example 6.

| Device | Example | Device Efficiency (W/A) | CIEx | Δ CIEx[1] | CIEy | Volt[2] (V) | Δ Volt[1] (V) | Stability[3] |
|---|---|---|---|---|---|---|---|---|
| 4-1 | Comparison | 0.085 | 0.135 | 0% | 0.192 | 8.3 | 0% | 46% |
| 4-2 | Invention | 0.069 | 0.143 | 6% | 0.193 | 8.2 | −1% | 63% |

[1]Change relative to device 1-1.
[2]Average voltage of four devices.
[3]Relative % Luminance Remaining After 100 h.

It can be seen from Table 6a that the inventive device shows a reduction in voltage relative to the comparative device 4-1. It also affords improved stability.

The entire contents of the patents and other publications referred to in this specification are incorporated herein by reference. The invention has been described in detail with particular reference to certain preferred embodiments thereof, but it will be understood that variations and modifications can be effected within the spirit and scope of the invention.

| PARTS LIST | |
|---|---|
| 101 | Substrate |
| 103 | Anode |
| 105 | Hole-Injecting layer (HIL) |
| 107 | Hole-Transporting Layer (HTL) |
| 109 | Light-Emitting layer (LEL) |
| 110 | Hole-Blocking layer (HBL) |
| 111 | Electron-Transporting layer (ETL) |
| 112 | Electron-Injecting layer (EIL) |
| 113 | Cathode |
| 150 | Power Source |
| 160 | Conductor |

The invention claimed is:

1. An OLED device comprising a cathode, an electron-transporting layer (ETL), a light-emitting layer (LEL) containing a fluorescent light-emitting material, a hole-transporting layer (HTL), and an anode, in that order, wherein the ETL comprises a mixture of compounds, including a first compound and at least one second compound, and wherein there is present a hole blocking layer (HBL) adjacent to the LEL on the cathode side, wherein the first compound is present in an amount of 50% to 90% by volume and is represented by Formula (2):

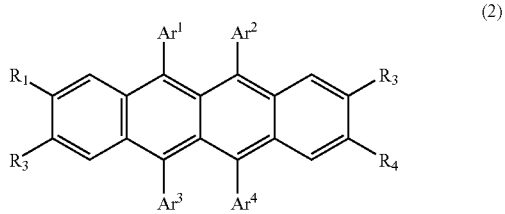

(2)

wherein:
$R_1$ and $R_4$ represent the same substituent and neither are hydrogen;
$R_2 R_3$ represent hydrogen;
$Ar^1$ and $Ar^4$ represent the same aromatic group; and
$Ar^2$ and $Ar^3$ represent the same aromatic group.

2. The OLED device of claim 1 wherein the second compound is represented by Formula (4):

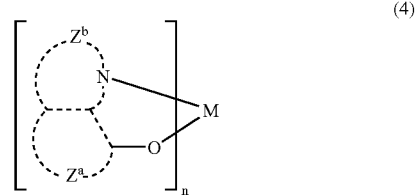

(4)

wherein:
M represents a metal;
n is an integer of from 1 to 4; and
each $Z^a$ and $Z^b$ independently represents the atoms necessary to complete an aromatic ring group.

3. The device of claim 1 wherein the second compound comprises a monovalent metal.

4. The device of claim 1 wherein the second compound comprises a divalent metal.

5. The OLED device of claim 1 wherein the second compound is represented by Formula (4a):

$$(M^a)p(Q)p \quad (4a)$$

wherein:
$M^a$ represents a monovalent metal;
Q represents a bidentate ligand; and
p is an integer.

6. The OLED device of claim 1 wherein the second compound is represented by Formula (5):

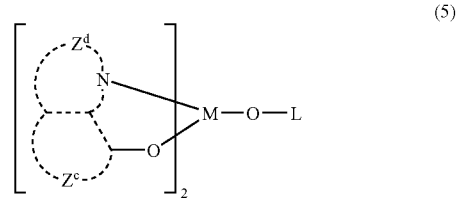

(5)

wherein:
M is a metal;
L represents an aromatic group; and
each $Z^c$ and $Z^d$ independently represents the atoms necessary to complete an aromatic ring group.

7. The OLED device of claim 1 wherein the second compound(s) is represented by Formula (6), Formula (7), Formula (8) or Formula (9):

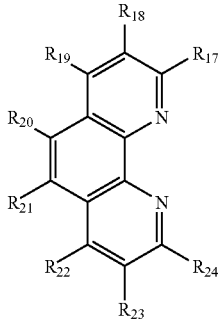
(6)

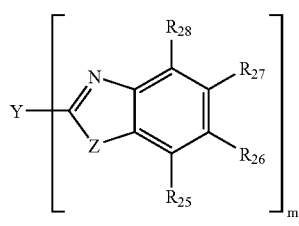
(7)

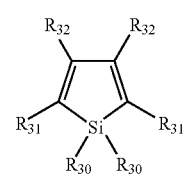
(8)

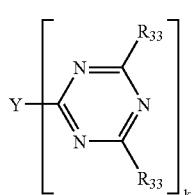
(9)

wherein:

Z is O, $NR_{29}$, or S;

$R_{17}$, $R_{18}$, $R_{19}$, $R_{20}$, $R_{21}$, $R_{22}$, $R_{23}$ and $R_{24}$ are hydrogen or substituents, provided that any of the indicated substituents may join to form further fused ring;

$R_{25}$, $R_{26}$, $R_{27}$, and $R_{28}$ represent hydrogen or a substituent;

$R_{29}$ represents a substituent;

$R_{30}$, $R_{31}$, and $R_{32}$ represent hydrogen or substituents or are the atoms necessary to complete a fused carbocyclic or heterocyclic ring group;

$R_{33}$ represents hydrogen or a substituent;

Y is a linkage unit comprising an alkyl group or an aryl group that connects the multiple heterocycles together;

k is an integer of from 1 to 4; and m is an integer of from 3 to 8.

8. The device of claim 1 wherein the hole-blocking layer includes a compound represented by Formula (3):

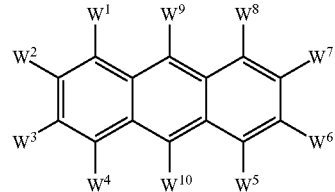
(3)

wherein:

$W^1$-$W^{10}$ independently represent hydrogen or an independently selected substituent, provided that two adjacent substituents can combine to form rings.

9. The device of claim 1 wherein the hole-blocking layer includes a compound of Formula (4):

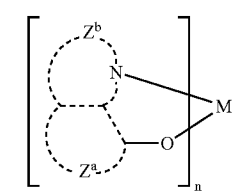
(4)

wherein:

M represents a metal;

n is an integer of from 1 to 4; and each $Z^a$ and $Z^b$ independently represents the atoms necessary to complete an aromatic ring group.

10. The OLED device of claim 1 wherein the hole-blocking layer includes a compound represented by Formula (5):

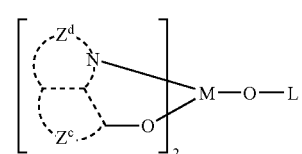
(5)

wherein:

M is a metal;

L represents an aromatic group; and each $Z^c$ and $Z^d$ independently represent the atoms necessary to complete an aromatic ring group.

11. The device of claim 1 wherein the hole-blocking layer includes a compound represented by Formula (7):

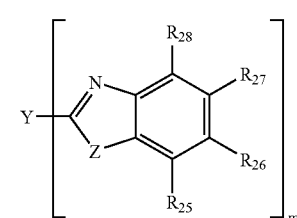
(7)

wherein:

m is an integer of from 3 to 8;

Z is O, $NR_{29}$, or S;

$R_{25}$, $R_{26}$, $R_{27}$, and $R_{28}$ represent hydrogen or a substituent; $R_{29}$ represents a substituent; and Y is a linkage unit comprising an alkyl group or an aryl group that connects the multiple heterocycles together.

12. The device of claim 1 wherein the fluorescent material comprises a perylene group, a distyrylbenzene group, a distyrylbiphenyl group, or a rubrene group.

13. The device of claim 1 wherein the ETL includes a first compound, a second compound, and a metallic material based on a metal having a work function less than 4.2 eV.

* * * * *

UNITED STATES PATENT AND TRADEMARK OFFICE
CERTIFICATE OF CORRECTION

PATENT NO. : 7,563,518 B2 Page 1 of 1
APPLICATION NO. : 11/192072
DATED : July 21, 2009
INVENTOR(S) : William J. Begley et al.

It is certified that error appears in the above-identified patent and that said Letters Patent is hereby corrected as shown below:

| | |
|---|---|
| Title Page, Col. 2, Line 13<br>Item [57] (Abstract) | Delete "Wherein" and insert -- wherein --, therefor. |
| Title Page, Col. 2, Line 13<br>Item [57] (Abstract) | After "the" insert -- same --. |
| Column 61, Line 65<br>Claim 1 | In Claim 1, delete "$R_2R_3$represent" and insert -- $R_2$ and $R_3$ represent --, therefor. |

Signed and Sealed this

Sixteenth Day of November, 2010

David J. Kappos
*Director of the United States Patent and Trademark Office*